United States Patent
Tian et al.

(10) Patent No.: US 11,874,699 B2
(45) Date of Patent: Jan. 16, 2024

(54) DISPLAY PANEL AND DISPLAY APPARATUS

(71) Applicant: WUHAN TIANMA MICROELECTRONICS CO., LTD., Wuhan (CN)

(72) Inventors: Xu Tian, Wuhan (CN); Fei Li, Wuhan (CN); Dongliang Dun, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 17/866,850

(22) Filed: Jul. 18, 2022

(65) Prior Publication Data
US 2022/0357770 A1    Nov. 10, 2022

(30) Foreign Application Priority Data

Feb. 9, 2022   (CN) .......................... 202210122841.4

(51) Int. Cl.
*G06F 1/16* (2006.01)
*H10K 59/131* (2023.01)

(52) U.S. Cl.
CPC ......... *G06F 1/1616* (2013.01); *H10K 59/131* (2023.02)

(58) Field of Classification Search
CPC .............................. G06F 1/1616; G06F 1/1652
See application file for complete search history.

(56) References Cited

U.S. PATENT DOCUMENTS

| | | | | |
|---|---|---|---|---|
| 8,043,115 | B2* | 10/2011 | Zieger | H05K 1/189 |
| | | | | 439/502 |
| 11,460,948 | B2* | 10/2022 | Han | G06F 3/0446 |
| 2018/0351117 | A1* | 12/2018 | Kim | H10K 59/127 |
| 2019/0018050 | A1* | 1/2019 | Wang | G06F 3/04164 |
| 2021/0181888 | A1* | 6/2021 | Yan | G06F 3/0445 |
| 2022/0066609 | A1* | 3/2022 | Han | G06F 3/0446 |
| 2022/0408548 | A1* | 12/2022 | Niu | H05K 1/189 |

FOREIGN PATENT DOCUMENTS

| CN | 109541865 A | 3/2019 |
|---|---|---|
| CN | 112614868 A | 4/2021 |

* cited by examiner

*Primary Examiner* — Adrian S Wilson
(74) *Attorney, Agent, or Firm* — Christensen O'Connor Johnson Kindness PLLC

(57) ABSTRACT

Provided is a display panel, including: a main body having a display region; and a rear folding portion provided with a plurality of binding pins. In an embodiment, the rear folding portion is bendable, and at least a part of the rear folding portion is capable of being folded back to a side of a backlight surface of the main body. In an embodiment, an edge of the rear folding portion that is connected to the main body is a first edge, and the first edge extends along a first direction. In an embodiment, the main body includes two second edges arranged opposite to each other along the first direction. In an embodiment, a vertical distance between an endpoint of the first edge and a line of one second edge most adjacent thereto is d1, and a minimum distance between two second edges is d2, $0.025 \leq d1/d2 \leq 0.25$.

32 Claims, 24 Drawing Sheets

DISPLAY PANEL AND DISPLAY APPARATUS

CROSS-REFERENCE TO RELATED APPLICATION

The present application claims to the benefit of Chinese Patent Application No. 202210122841.4, filed on Feb. 9, 2022, the content of which is incorporated herein by reference in its entirety.

TECHNICAL FIELD

The present disclosure relates to the field of display technologies and, particularly, relates to a display panel and a display apparatus.

BACKGROUND

With increasing display requirements from the consumers, flexible display screens have become a trend nowadays since they can provide a better user experience. However, conventional driving circuits, peripheral traces, binding printed circuit boards, and the like are required to be provided in a peripheral circuit region of a display panel, especially in a lower border of the display panel. Functional circuits, signal leads, binding pins, and other components are provided in this region. In a flexible displaying process, it is better arrange the peripheral circuit region to improve reliability of the display panel.

SUMMARY

In view of the above, embodiments of the present disclosure provide a display panel and a display device to solve the above problem.

In a first aspect of the present disclosure, a display panel is provided. In an embodiment, the display panel includes: a main body having a display region; and a rear folding portion provided with a plurality of binding pins. In an embodiment, the rear folding portion is bendable, and at least a part of the rear folding portion is capable of being folded back to a side of a backlight surface of the main body. In an embodiment, an edge of the rear folding portion that is connected to the main body is a first edge, and the first edge extends along a first direction. In an embodiment, the main body includes two second edges arranged opposite to each other along the first direction. In an embodiment, a vertical distance between an endpoint of the first edge and a line where one of the second edges most adjacent to the endpoint is located is a first distance d1, and a minimum distance between the two second edges along the first direction is a second distance d2, and $0.025 \leq d1/d2 \leq 0.25$.

In a second aspect of the present disclosure, a display apparatus is provided. In an embodiment, the display apparatus includes a display panel, and the display panel includes a main body having a display region; and a rear folding portion provided with a plurality of binding pins. In an embodiment, the rear folding portion is bendable, and at least a part of the rear folding portion is capable of being folded back to a side of a backlight surface of the main body. In an embodiment, an edge of the rear folding portion that is connected to the main body is a first edge, and the first edge extends along a first direction. In an embodiment, the main body includes two second edges arranged opposite to each other along the first direction. In an embodiment, a vertical distance between an endpoint of the first edge and a line where one of the second edges most adjacent to the endpoint is located is a first distance d1, and a minimum distance between the two second edges along the first direction is a second distance d2, and $0.025 \leq d1/d2 \leq 0.25$.

BRIEF DESCRIPTION OF DRAWINGS

In order to better illustrate technical solutions of embodiments of the present disclosure, the accompanying drawings used in embodiments are briefly described below. The drawings described below are merely a part of the embodiments of the present disclosure. Based on these drawings, those skilled in the art can obtain other drawings.

DESCRIPTION OF EMBODIMENTS

In order to better understand the technical solutions of the present disclosure, the embodiments of the present disclosure are described in detail below with reference to the accompanying drawings.

It should be clear that the described embodiments are only a part of the embodiments of the present disclosure, but not all of the embodiments. Based on the embodiments in the present disclosure, all other embodiments obtained by those of ordinary skill in the art without creative efforts fall within the protection scope of the present disclosure.

The terms used in the embodiments of the present disclosure are only for the purpose of describing specific embodiments, and are not intended to limit the present disclosure. As used in the embodiments of the present disclosure and the appended claims, the singular forms "a/an" "the" and "said" are intended to include the plural forms as well, unless the context clearly dictates otherwise.

It should be understood that the term "and/or" used in this document is only an association relationship to describe the associated objects, indicating that there may be three relationships, for example, A and/or B, which may indicate that A alone, A and B, and B alone. The character "/" in this document generally indicates that the related objects are an "or" relationship.

In this specification, it should be understood that words such as "basically", "approximately", "about", "substantially" and "generally" described in the claims and embodiments of the present disclosure refer to a value within a reasonable technological operating ranges or tolerance ranges, which may be generally approved and is not a precise value.

It should be understood that although the terms 'first', 'second' and 'third' can be used in the present disclosure to describe connecting lines, these connecting lines should not be limited to these terms. These terms are used only to distinguish connecting lines from each other. For example, without departing from the scope of the embodiments of the present disclosure, a first connecting line can also be referred to as a second connecting line. Similarly, the second connecting line can also be referred to as the first connecting line.

It will be apparent to those skilled in the art that various modifications and variations can be made in the present disclosure without departing from the spirit or scope of the application. Accordingly, the present disclosure is intended to cover the modifications and variations of the present disclosure that fall within the scope of the corresponding claims (claimed technical solutions) and their equivalents. It should be noted that, the embodiments provided in the present disclosure can be combined with each other if there is no contradiction.

Through careful and in-depth research, the applicant provides a solution to address the problems in the related art.

Figure 1:
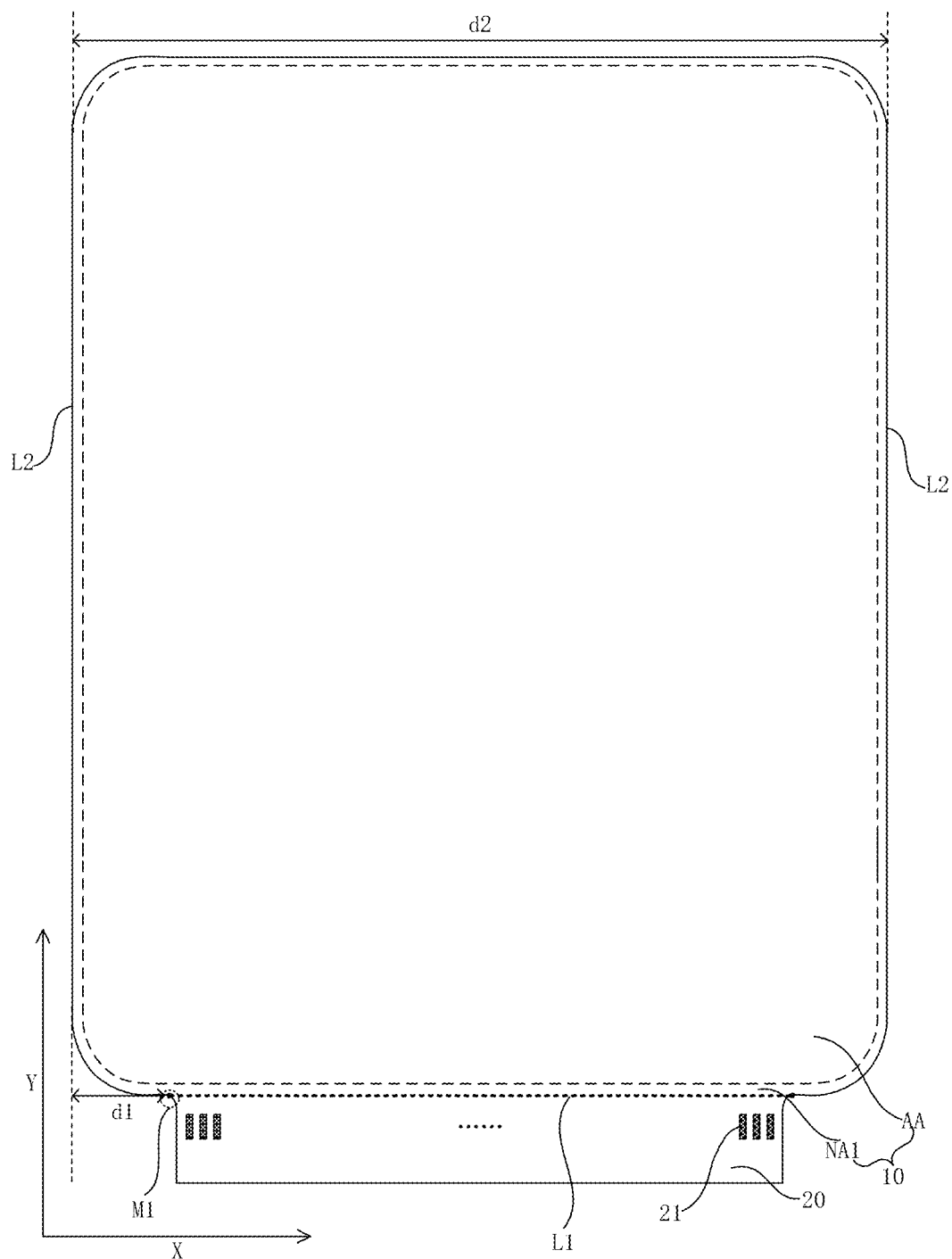
FIG. 1 is a schematic diagram of a display panel unfolded according to an embodiment of the present disclosure.
Figure 2:
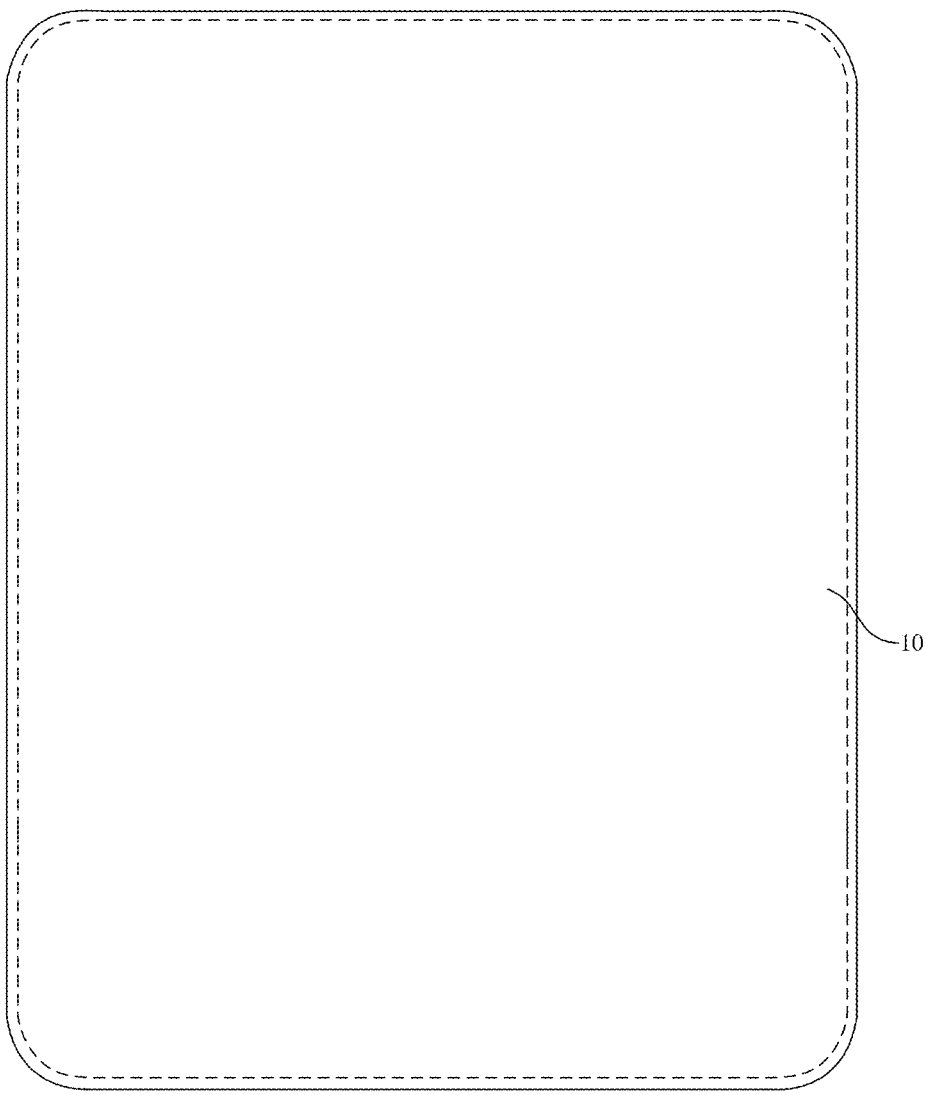
FIG. 2 is a front view of a display panel according to an embodiment of the present disclosure.
Figure 3:
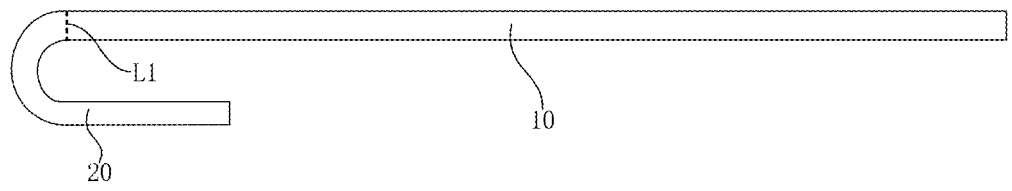
FIG. 3 is a cross-sectional view of a display panel according to an embodiment of the present disclosure.

FIG. 1 is a schematic diagram of a display panel unfolded according to an embodiment of the present disclosure, FIG. 2 is a front view of a display panel according to an embodiment of the present disclosure, and FIG. 3 is a cross-sectional view of a display panel according to an embodiment of the present disclosure.

In an embodiment of the present disclosure, a display panel includes a main body 10 and a rear folding portion 20. The rear folding portion 20 can be bent. At least part of the rear folding portion 20 can be folded back to a side of a backlight surface of the main body 10. Referring to FIG. 1, FIG. 2, and FIG. 3, the display panel is a bendable display panel, which can be a flexible display panel or a curved display panel.

In general, the structure of the display panel in a using state is shown in FIG. 2 and FIG. 3, that is, the rear folding portion 20 is bent, and at least part of the rear folding portion 20 is folded back to a side of a backlight surface of the main body 10. For example, when the display panel is applied to a display apparatus, at least part of the rear folding portion 20 is folded back to a side of the backlight surface of the main body 10. In an embodiment of the present disclosure, as shown in FIG. 1, the display panel can be of a state in which the rear folding portion 20 is unfolded. In an embodiment of the present disclosure, as shown in FIG. 2, the display panel can also be of a state in which the rear folding portion 20 has been folded back.

The main body 10 includes a display region AA in which light-emitting display is performed. The display region AA includes light-emitting pixels (e.g., OLED, Micro LED) for light-emitting display.

The rear folding portion 20 is provided with multiple binding pins 21. The binding pin 21 can be connected to a chip (not shown) or a flexible circuit board (not shown) integrated with a chip. By providing the rear folding portion 20, the border binding the chip or the flexible circuit board in the display panel can be folded to the back of the display panel, so that the width of the border of the display panel is reduced in the using state, thereby achieving a high screen-to-body ratio of the display panel upon light-emitting display.

An edge of the rear folding portion 20 that is in contact with the main body 10 is a first edge L1. The first edge L1 extends along a first direction X. For example, a virtual boundary between the rear folding portion 20 and the main body 10 coincides with the first edge L1. As shown in FIG. 1, the first edge L1 extends along a left-right direction corresponding to the first direction X.

The main body 10 includes two second edges L2 provided opposite to each other along the first direction X. As shown in FIG. 1, the two second edges L2 included in the main body 10 can be the edges at left and right sides of the main body 10.

A vertical distance from an endpoint of the first edge L1 to a straight line where the nearest second edge L1 is located is a first distance d1. As shown in FIG. 1, a vertical distance from a left endpoint of the first edge L1 to a straight line where the second edge L2 at the left side of the main body 10 is located is d1, and a vertical distance from a right endpoint of the first edge L1 to a straight line where the second edge L2 at the right side of the main body 10 is located can also be d1.

A minimum distance between two second edges L2 opposite to each other along the first direction X is a second distance d2. As shown in FIG. 1, a minimum distance between left and right edges of the main body 10 along the first direction X is the second distance d2. A maximum width of the display panel along the first direction X can be the second distance d2.

In an embodiment of the present disclosure, $0.025 \leq d1/d2 \leq 0.25$. That is, the endpoint of the first edge L1 in the rear folding portion 20 retracts inward relative to the straight line where the second edge L2 of the main body 10 is located. The vertical distance from the endpoint of the first edge L1 to the straight line where the nearest second edge L2 is located is smaller than or equal to 0.25 times of the width of the display panel along the first direction X, and is greater than or equal to 0.025 times of the width of the display panel along the first direction X.

In an embodiment of the present disclosure, the part of the lower border of the display panel where the binding pins are provided retracts inward along the first direction X to form the rear folding portion 20. A distance from a side of the lower border retracted inward to an inner side of the display panel along the first direction X is smaller than or equal to 0.25 times of the width of the display panel along the first direction X, and is greater than or equal to 0.025 times of the width of the display panel along the first direction X.

In the present disclosure, the width of the rear folding portion 20 along the first direction X can be reduced by retracting inward the lower border at the position of the rear folding portion 20, so that the space occupied by the rear folding portion 20 in the whole apparatus after being bent, thereby achieving lightness and thinness of the display panel and the display apparatus. Moreover, a risk of wire breakage in the folding-back region of the lower border can be reduced, and accuracy of process alignment can be increased, thereby improving a yield rate of when modules are assembled. Meanwhile, binding stress between the rear folding portion 20 and the chip or the flexible circuit board can be reduced, and the influence of wrapping and the like on normal wiring and display of the display panel can be reduced.

If a width of the lower border along the first direction X is same as a width of the main body of the display panel, the longer length of the lower border may affect the bending of the left and right borders of the display panel to form a double-curved or four-curved screen. By retracting inward the lower border of the display panel to form the rear folding portion 20, it is beneficial to achieve the double-curved or four-curved screen.

In an embodiment of the present disclosure, $0.06 \leq d1/d2 \leq 0.12$. That is, a vertical distance from the endpoint of the first edge L1 in the rear folding portion 20 to a straight line where the nearest adjacent second edge L1 is located is 0.06 times or more of the width of the display panel along the first direction X, and 0.12 times or less of the width of the display panel along the first direction X.

A side of the inwardly retracted lower border closest to the main body 10 is retracted toward inner side of the display panel along the first direction X by a distance smaller than or equal to 0.12 times of the width of the display panel along the first direction X and greater than or equal to 0.06 times of the width of the display panel along the first direction X.

With the goal of a reasonable layout of signal lines, module assembly yield, and binding yield in the display panel, the present disclosure provides that when $0.06 \leq d1/d2 \leq 0.12$, the display panel can achieve double-curved or four-curved screen, and can also provide stability of the signal transmitted by the signal line while rationally laying out the signal lines.

In an embodiment of the present disclosure, $0.09 \leq d1/d2 \leq 0.19$. That is, a vertical distance from the endpoint of the first edge L1 in the rear folding portion 20 to a straight line where the nearest adjacent second edge L1 is located is 0.09 times or more of the width of the display panel along the first direction X, and 0.19 times or less of the width of the display panel along the first direction X.

A ratio of d1 to d2 can be any one of 0.093, 0.1, 0.173, and 0.18.

Optionally, $d1 \geq 3.5$ mm. That is, a vertical distance from the endpoint of the first edge L1 in the rear folding portion 20 to a straight line where the nearest adjacent second edge L1 is located is greater than or equal to 3.5 mm. A side of the inwardly retracted lower border closest to the main body 10 is retracted toward inner side of the display panel along the first direction X by a distance of greater than or equal to 3.5 mm. When $d1 \geq 3.5$ mm, the display panel can achieve an ideal narrow border and a double-curved or four-curved screen during light-emitting display. For example, d1 can be equal to 5 mm.

Further, in an embodiment, $13 \text{ mm} \geq d1 \geq 7 \text{ mm}$, that is, a vertical distance from the endpoint of the first edge L1 in the rear folding portion 20 to a straight line where the nearest adjacent second edge L1 is located is greater than or equal to 7 mm and smaller than or equal 25 to 13 mm.

In an embodiment of the present disclosure, $d1=9$ mm. That is, a vertical distance from the endpoint of the first edge L1 in the rear folding portion 20 to a straight line where the nearest adjacent second edge L1 is located is 9 mm. In an embodiment of the present disclosure, a side of the inwardly retracted lower border closest to the main body 10 is retracted toward inner side of the display panel along the first direction X by a distance of 9 mm.

The value of d1 can further be any one of 8 mm, 11 mm, and 13 mm.

As shown in FIG. 1, a width of the non-display region located between the display region AA and the rear folding portion 20 along the first direction X is greater than a width of the rear folding portion 20 along the first direction X, so that there is a certain radian at an edge of a corner M1 where the rear folding portion 20 intersects with the non-display region. In the present disclosure, for convenience of description, the radian of the edge at M1 can be ignored. The first edge L1 of the rear folding portion 20 can be located above the M1 position as shown in FIG. 1, or below the M1 position.

In an embodiment of the present disclosure, as shown in FIG. 1, the rear folding portion 20 can be a rectangular structure or a quasi-rectangular structure.

Figure 4:
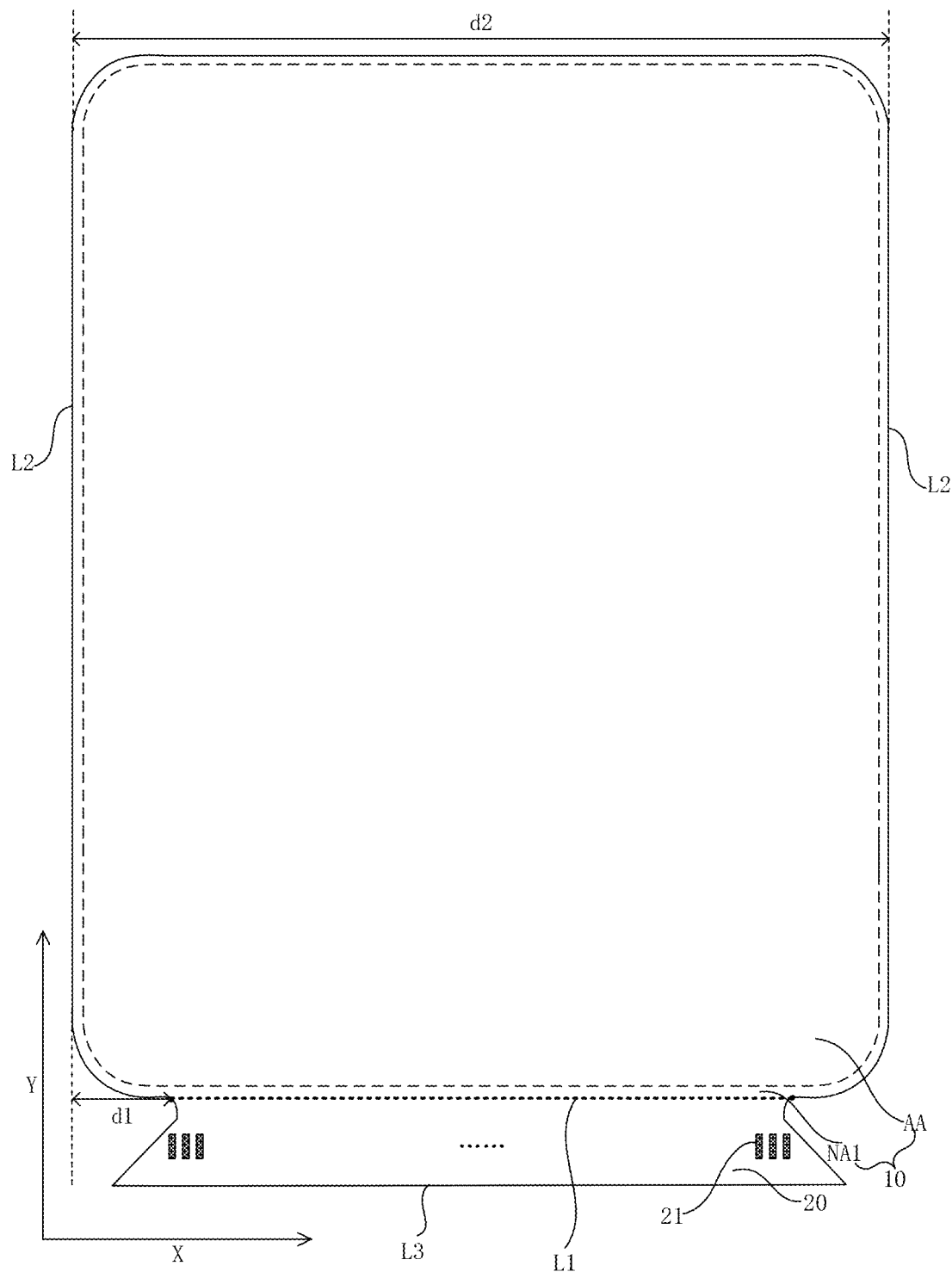
FIG. 4 is another schematic view of a display panel unfolded according to an embodiment of the present disclosure.

FIG. 4 is another schematic view of a display panel unfolded according to an embodiment of the present disclosure.

In an embodiment of the present disclosure, as shown in FIG. 4, the rear folding portion 20 further includes a third edge L3 opposite to the first edge L1 along a second direction Y. The third edge L3 has a greater length than the first edge L1. The second direction Y intersects with the first direction X.

As shown in FIG. 4, the rear folding portion 20 is a structure with a narrow top and a wide bottom, so that the rear folding portion 20 can have enough space for arranging binding pins. Meanwhile, a distance retracted inward of a side of the inwardly retracted lower border that is closest to the main body 10, toward an inner side of the display panel along the first direction X can be set larger, so that the display panel can have a narrow border during light-emitting display, thereby further improving the screen-to-body ratio.

In an embodiment of the present embodiment, as shown in FIG. 4, the rear folding portion 20 can be an isosceles trapezoid structure (or a quasi-isosceles trapezoid structure), in which an upper base of the isosceles trapezoid is shorter than a lower base and closer to the main body 10 of the display panel.

Figure 5:
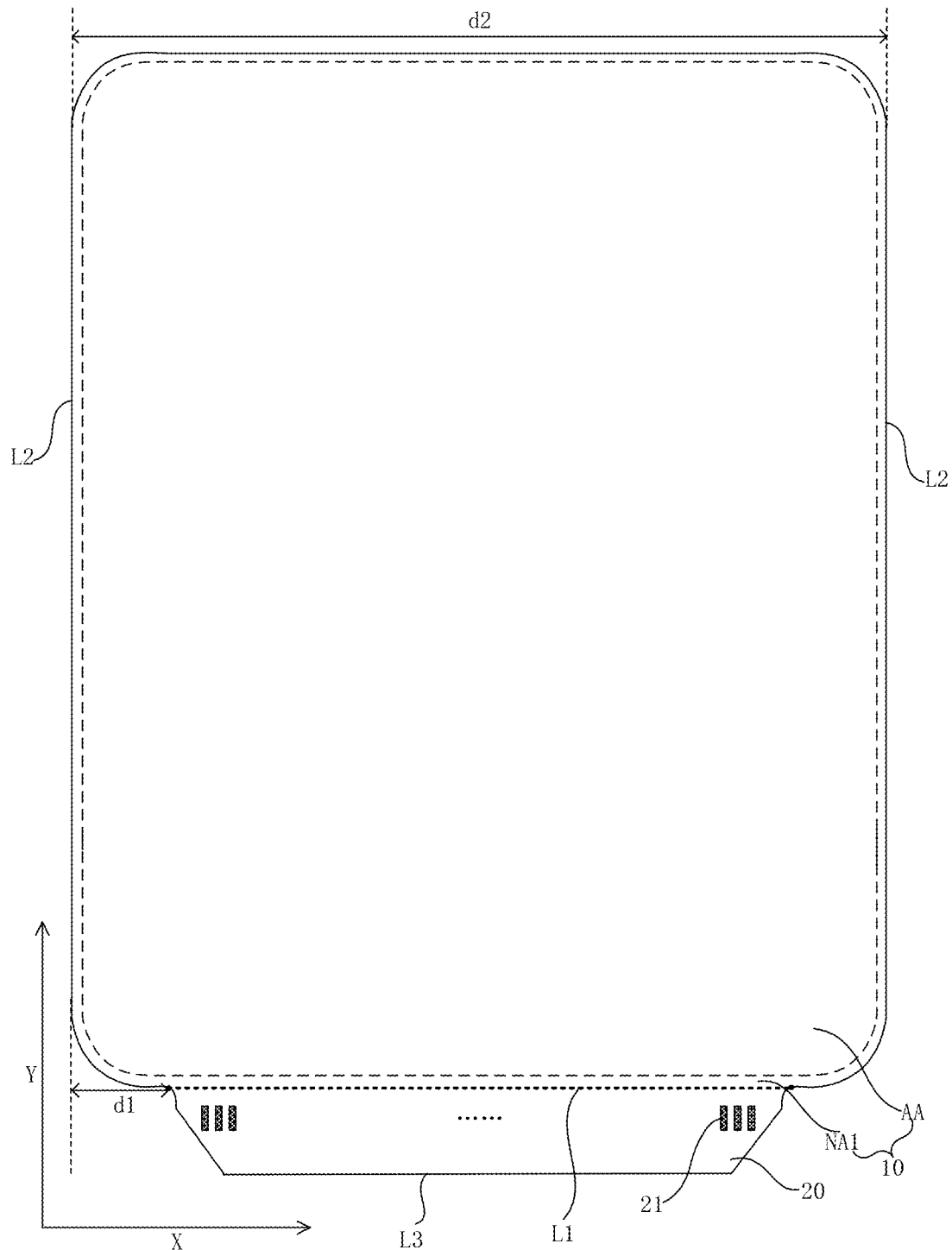
FIG. 5 is another schematic diagram of a display panel unfolded according to an embodiment of the present disclosure.

FIG. 5 is another schematic diagram of a display panel unfolded according to an embodiment of the present disclosure.

In an embodiment of the present disclosure, as shown in FIG. 5, the rear folding portion 20 further includes a third edge L3 opposite to the first edge L1 along a second direction. The third edge L3 has a smaller length than the first edge L1. The second direction Y intersects with the first direction X.

As shown in FIG. 5, the rear folding portion 20 is a structure with a narrow top and a wide bottom, so that the rear folding portion 20 can have a smaller area on the premise that the display panel can achieve a double-curved or four-curved screen and a smaller border, thereby achieving a thinner and lighter whole apparatus, and increasing alignment and binding yield.

In an embodiment of the present embodiment, as shown in FIG. 5, the rear folding portion 20 can be an isosceles trapezoid structure (or a quasi-isosceles trapezoid structure), in which an upper base of the isosceles trapezoid is longer than a lower base and closer to the main body 10 of the display panel.

Figure 6:
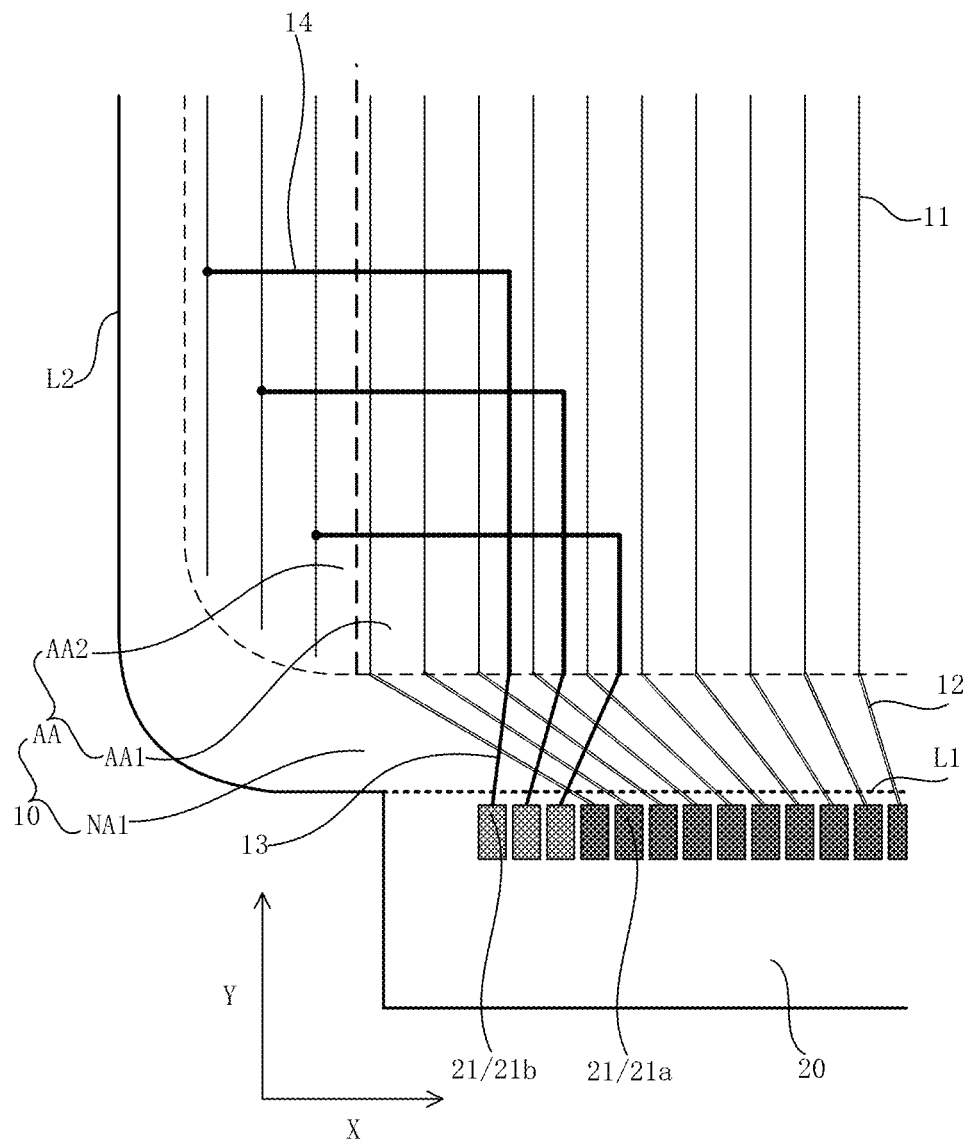
FIG. 6 is a partially enlarged view of a display panel according to an embodiment of the present disclosure.
Figure 7:
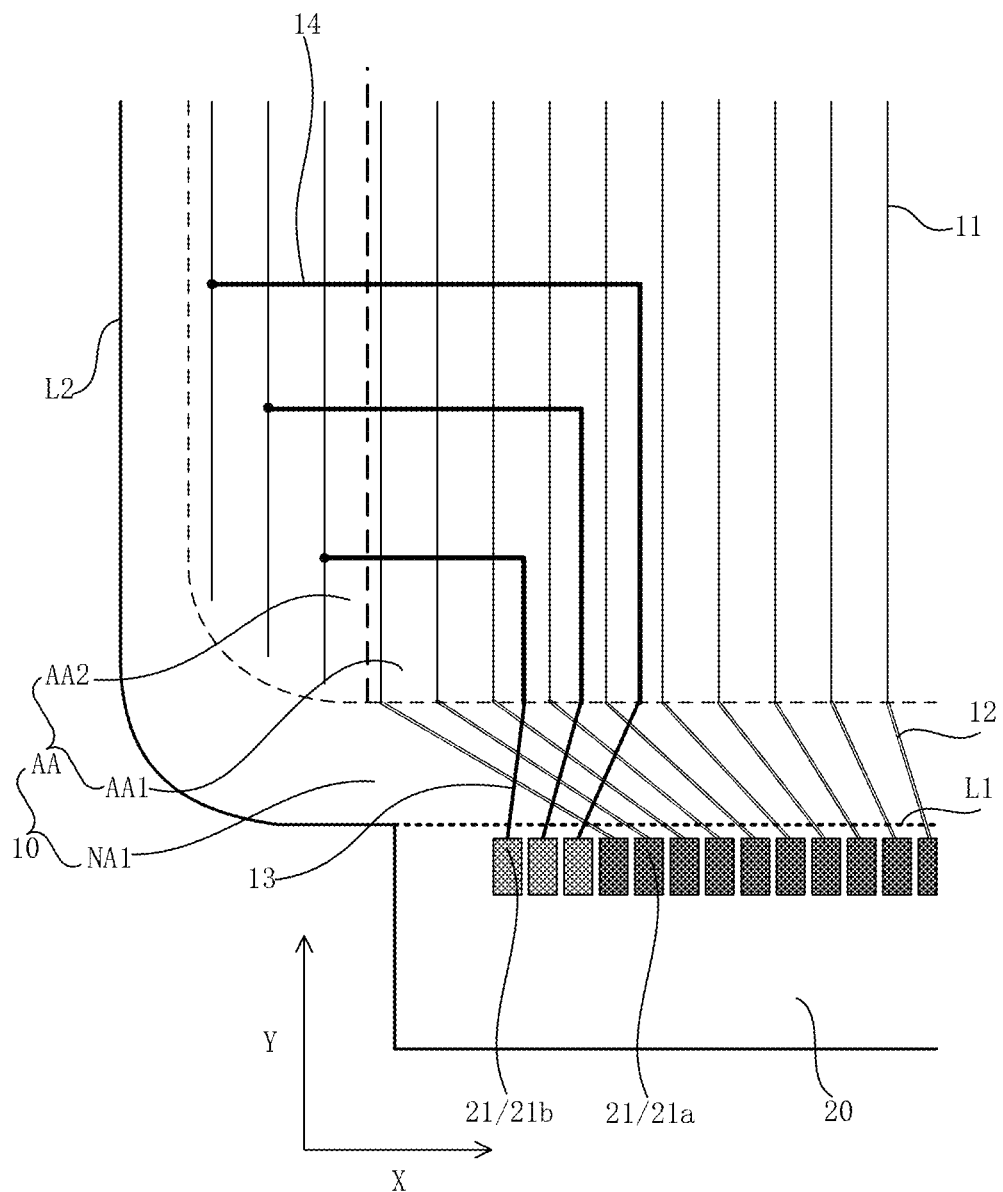
FIG. 7 is another partially enlarged view of a display panel according to an embodiment of the present disclosure.

FIG. 6 is a partially enlarged view of a display panel according to an embodiment of the present disclosure, and FIG. 7 is another partially enlarged view of a display panel according to an embodiment of the present disclosure.

As shown in FIG. 6 and FIG. 7, the main body 10 of the display panel can further include a first non-display region NA1. The first non-display region NA1 is located at a side of the display region AA close to the rear folding portion 20. By providing the binding pins 21 on the rear folding portion 20 and folding at least part of the rear folding portion 20 to a side of the backlight surface of the main body 10, the lower border of the display screen corresponding to the display panel only includes the first non-display region NA1, and does not include the part binding with a chip or a flexible circuit board, so that the display screen has a higher screen-to-body ratio.

Referring to FIG. 6 and FIG. 7, the display region AA includes first display regions AA1 and second display regions AA2. The second display region AA2 is located at a side of the first display region AA1 close to a second edge L2. As shown in FIG. 6 and FIG. 7, the first display region AA1 and the second display region AA2 are arranged along the first direction X. The second display region AA2 is located outside the first display region AA1. In an embodiment of the present disclosure, one second display region AA2 can be located between the first display region AA1 and a left border, and another second display region AA2 can be located in the first display region AA1 and the right border (not shown).

The display panel can be designed to be symmetrical from left to right. For convenience of description, only the left side of the display panel is taken as an example in the present disclosure and subsequent embodiments and the corresponding drawings to describe inventive concepts of the present disclosure.

The first display region AA1 and the second display region AA2 each include first signal lines 11 extending along the second direction Y and arranged along the first direction X. The first signal line 11 can provide signals for the light-emitting pixels in the first display region AA1 and the second display region AA2. For example, the first signal line 11 can provide data voltage signals for the light-emitting pixels. The second direction Y intersects with the first direction X.

A direction for arranging the display region AA, the first non-display region NA1 and the rear folding portion 20 can be the second direction Y. For example, the second direction Y can be perpendicular to the first direction X.

The first non-display region NA1 can further include first connecting lines 12 and second connecting lines 13. The display region AA can further include third connecting lines 14. The first signal lines 11 in the first display region AA1 are electrically connected to the binding pins 21 through the first connecting lines 12. The first signal lines 11 in the second display region AA2 are electrically connected to the binding pins 21 through the second connecting lines 13 and the third connecting lines 14.

The third connecting lines 13 extend from the second display region AA2 to the first display region AA1. In an embodiment of the present disclosure, the first signal lines 11 in the second display region AA2 can be electrically connected to the second connecting lines 13 located below the first display region AA1 in a non-display region NA1 through the third connecting lines 14 in the display region AA.

In an embodiment of the present disclosure, the second connecting lines 13 in the first non-display region NA1 transmit signals to part of first signal lines 11 close to the edge of the display region AA, and one end of the second connecting line 13 that is connected to the third connecting line 14 is provided at a position of the display panel away from the straight line where the second edge L2 is located. For example, as shown in FIG. 6 and FIG. 7, the ports of the second connecting lines 13 are located in the first non-display region NA corresponding to the position of the region where the rear folding portion 20 is located. By arranging in the display region AA the third connecting line 14 extending from the second display region AA2 to the first display region AA1 to connect the port with the first signal line 11 in the second display region AA2, the first signal line 11 in the second display region AA2 can be omitted at the corner position of a non-display region NA1 corresponding to the second display region AA2, so that the corner position of the display panel has a smaller width.

In an embodiment of the present disclosure, referring to FIG. 6 and FIG. 7, along the second direction Y, the first edge L1 is covered by the first display region AA1, so that a projection of the first edge L1 in the display region AA along the second direction Y is completely located in the first display region AA1. In an embodiment of the present disclosure, as shown in FIG. 6 and FIG. 7, the display region above the region where the rear folding portion 20 is located is the first display region AA1, a region where the second display region AA2 is located extends downward along the second direction Y to outside of the rear folding portion 20. For example, as shown in FIG. 6 and FIG. 7, a region where a second display region AA2 is located extends downward along the second direction Y to a left side of the left edge of the rear folding portion 20.

In an embodiment of the present disclosure, all first signal lines 11 in the display region AA corresponding to a region where the rear folding portion 20 is located are electrically connected to the binding pins 21 through the first connecting lines 12 without changing the position of the port connected to the connecting lines in the rear folding portion and the first signal lines by the winding in the display region AA, thereby avoiding increasing design difficulty of the display region AA of the display panel.

Figure 8:
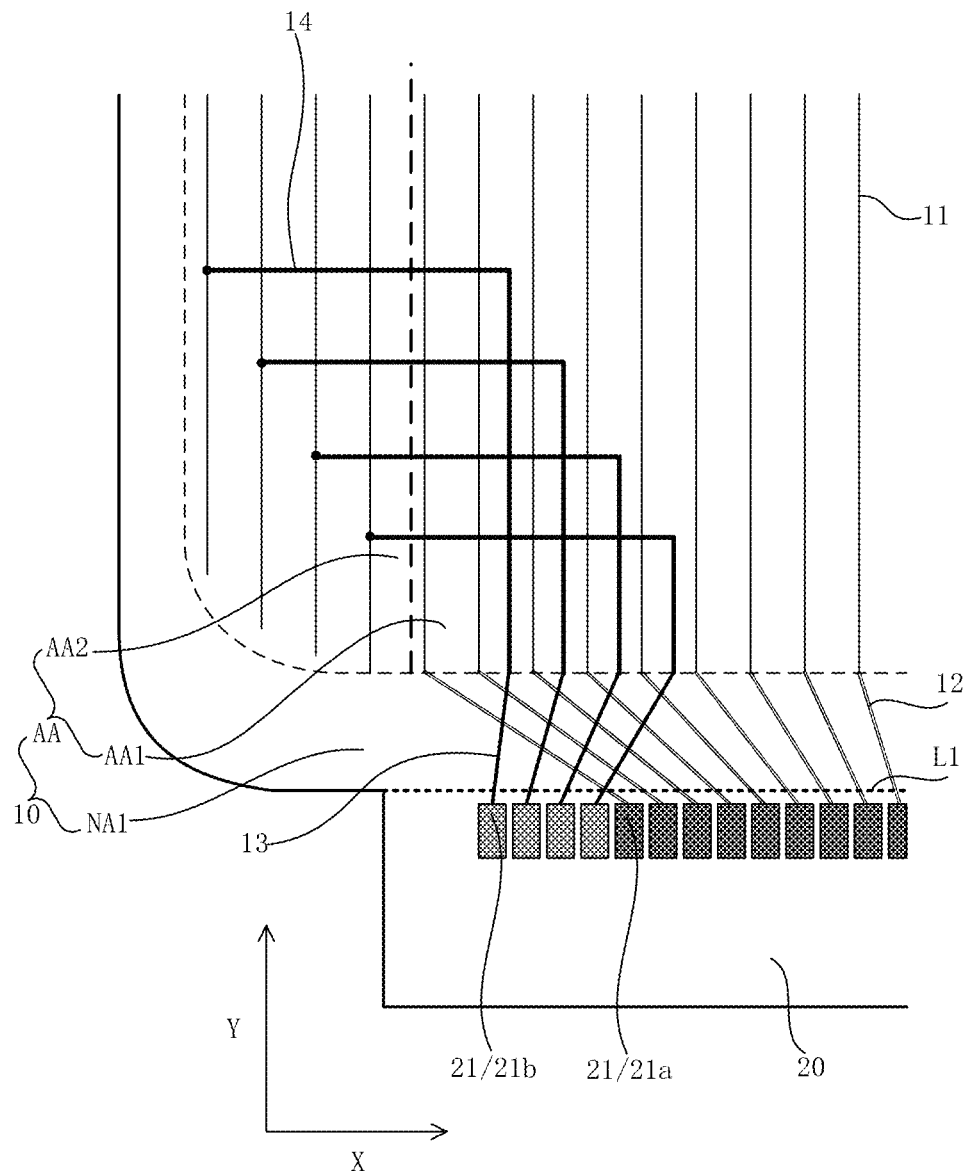
FIG. 8 is another partially enlarged view of a display panel according to an embodiment of the present disclosure.
Figure 9:
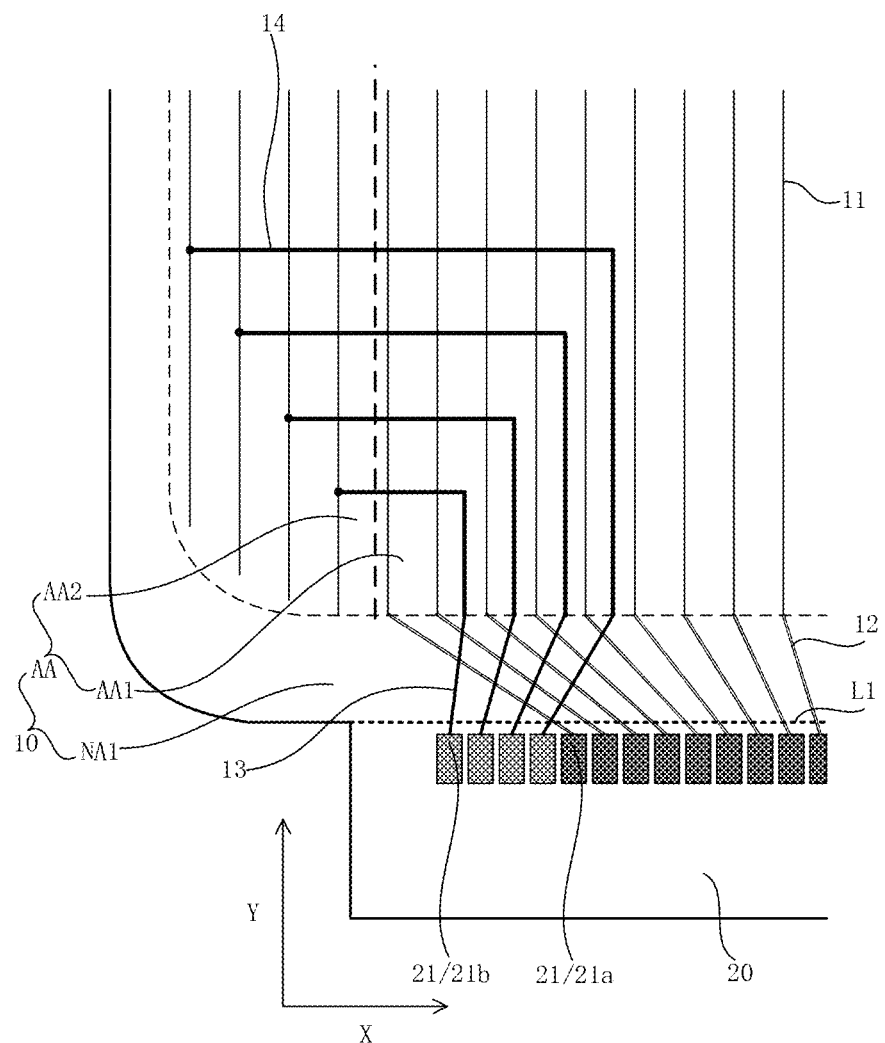
FIG. 9 is another partially enlarged view of a display panel according to an embodiment of the present disclosure.

FIG. 8 is another partially enlarged view of a display panel according to an embodiment of the present disclosure, and FIG. 9 is another partially enlarged view of a display panel according to an embodiment of the present disclosure.

As shown in FIG. 8 and FIG. 9, along the second direction Y, the first edge L1 overlaps with the second display region AA2, so that a portion of a projection of the first edge L1 in the display region AA along the second direction is located in the second display region AA2. A display region above the region where the rear folding portion 20 is located includes a portion of the second display region AA2, a region where the second display region AA2 is located extends downward along the second direction Y to partially overlap with the rear folding portion 20. For example, as shown in FIG. 8 and FIG. 9, a region where a second display region AA2 is located extends downward along the second direction Y and overlaps with the rear folding portion 20.

In an embodiment of the present disclosure, some first signal lines 11 in the display region AA corresponding to the region where the rear folding portion 20 is located are electrically connected to the binding pins 21 through the third connecting lines 14 and the second connecting lines 13, so that the port connecting the first signal lines 11 in the display region AA with the connecting lines in the first non-display region NA1 can be provided farther away from the straight line where the second edge L2 is located. Further, the inclination angle of the first connecting line 12 and the second connecting line 13 in the first non-display region NA1 can be reduced, so that it is beneficial to reduce the width of the first non-display region N1 along the second direction Y and increase the screen-to-body ratio of the display panel.

The first display region AA1 and the second display region AA2 are different regions of the display region AA. As mentioned above, the first non-display region AA1 and the second display region AA2 can be divided by whether or not the connecting line between the first signal line 11 and the binding pins 21 includes the third connecting line 14 located in the display region AA. It is appreciated that, there may not exist a clear boundary line between the first display region AA1 and the second display region AA2.

In an embodiment of the present disclosure, as shown in FIG. 6 to FIG. 9, along the second direction Y, at least a part of a side of the second display region AA2 close to the first non-display region NA1 retracts inward in a direction from a side of the first display region AA1 close to the first non-display region NA1 to a side of the first display region AA1 away from the first non-display region NA1. As shown in FIG. 6 and FIG. 7, a side of the second display region AA2 close to the first non-display region NA1 is chamfered, so that the area of the non-display region of the display panel at the corner can further be reduced, thereby achieving a high screen-to-body ratio. In addition, the above connection manner between the first signal line 11 and the binding pin 21 can reduce the chamfer width.

In an embodiment of the present disclosure, as shown in FIG. 6 to FIG. 9, multiple binding pins 21 provided in the rear folding portion 20 include first binding pins 21a and second binding pins 21b. The first binding pin 21a is electrically connected to the first connecting line 12, and the second binding pin 21b is electrically connected to the second connecting line 13. That is to say, the first binding pin 21a is electrically connected to the first signal line 11 in the first display region AA1 through the first connecting line 12 and transmits signals thereto. The second binding pin 21b is electrically connected to the first signal line 11 in the second display region AA2 through the second connecting line 13 and the third connecting line 14 and transmits signals thereto.

In an embodiment of the present disclosure, as shown in FIG. 6 to FIG. 9, multiple first binding pins 21a are arranged adjacent to one another in sequence, and multiple second binding pins 21b are arranged adjacent to one another in sequence. The second binding pins 21b electrically connected all first signal lines 11 located in one second display region AA2 are concentrated, which can reduce design cost of the binding pins.

Figure 10:
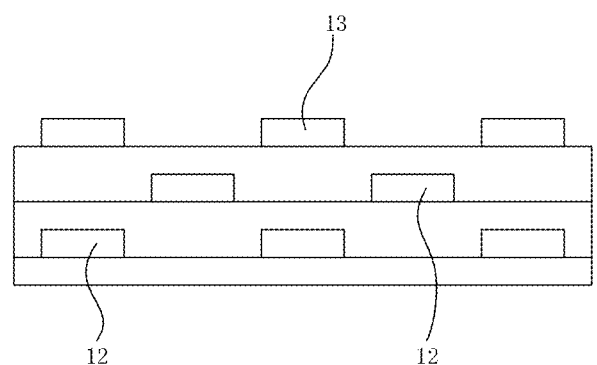
FIG. 10 is a partial cross-sectional view of the a non-display region shown in FIG. 6 to FIG. 9 according to an embodiment of the present disclosure.

FIG. 10 is a partial cross-sectional view of a first non-display region shown in FIG. 6 to FIG. 9 according to an embodiment of the present disclosure.

As shown in FIG. 10, when multiple first binding pins 21a are arranged in sequence, and multiple second binding pins 21b are arranged in sequence, the second connection line 13 overlaps with an orthographic projection of the first connecting line 12 in the thickness direction of the display panel, the second connecting line 13 and the first connecting line 12 can be provided in different layers.

For example, as shown in FIG. 10, due to a large number of first connecting lines 12, multiple first connecting lines 12 can be arranged in different layers. That is, some first connecting lines 12 are located in different conductive layers as other first connecting lines 12, so that etching accuracy of the first connecting lines 12 can be achieved, thereby avoiding short circuits between first connecting lines 12 adjacent to one another. Therefore, the conductive layer where the second connecting line 13 is located is different from any conductive layer where the first connecting lines 12 are located.

Figure 11:
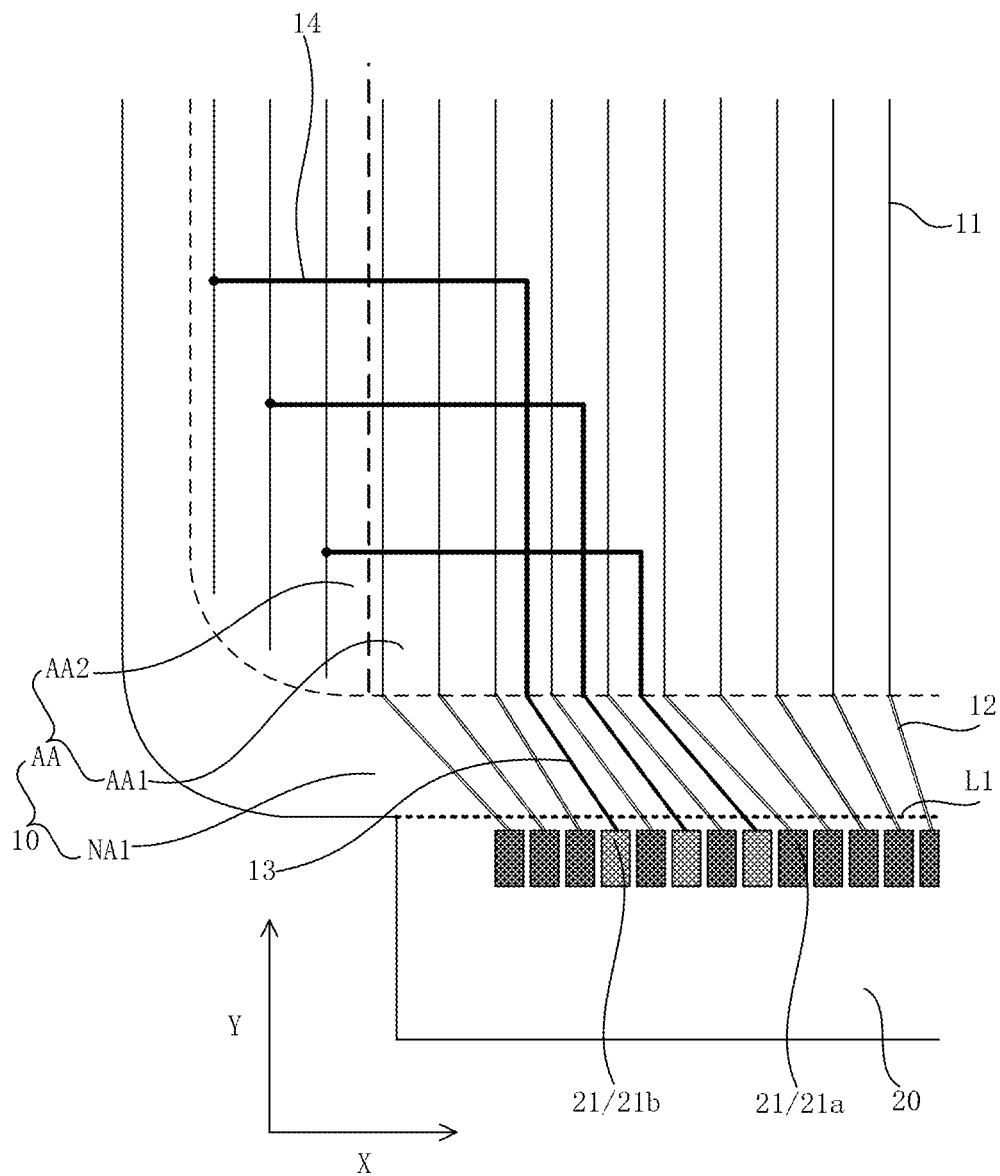
FIG. 11 is a partially enlarged view of a display panel according to an embodiment of the present disclosure.
Figure 12:
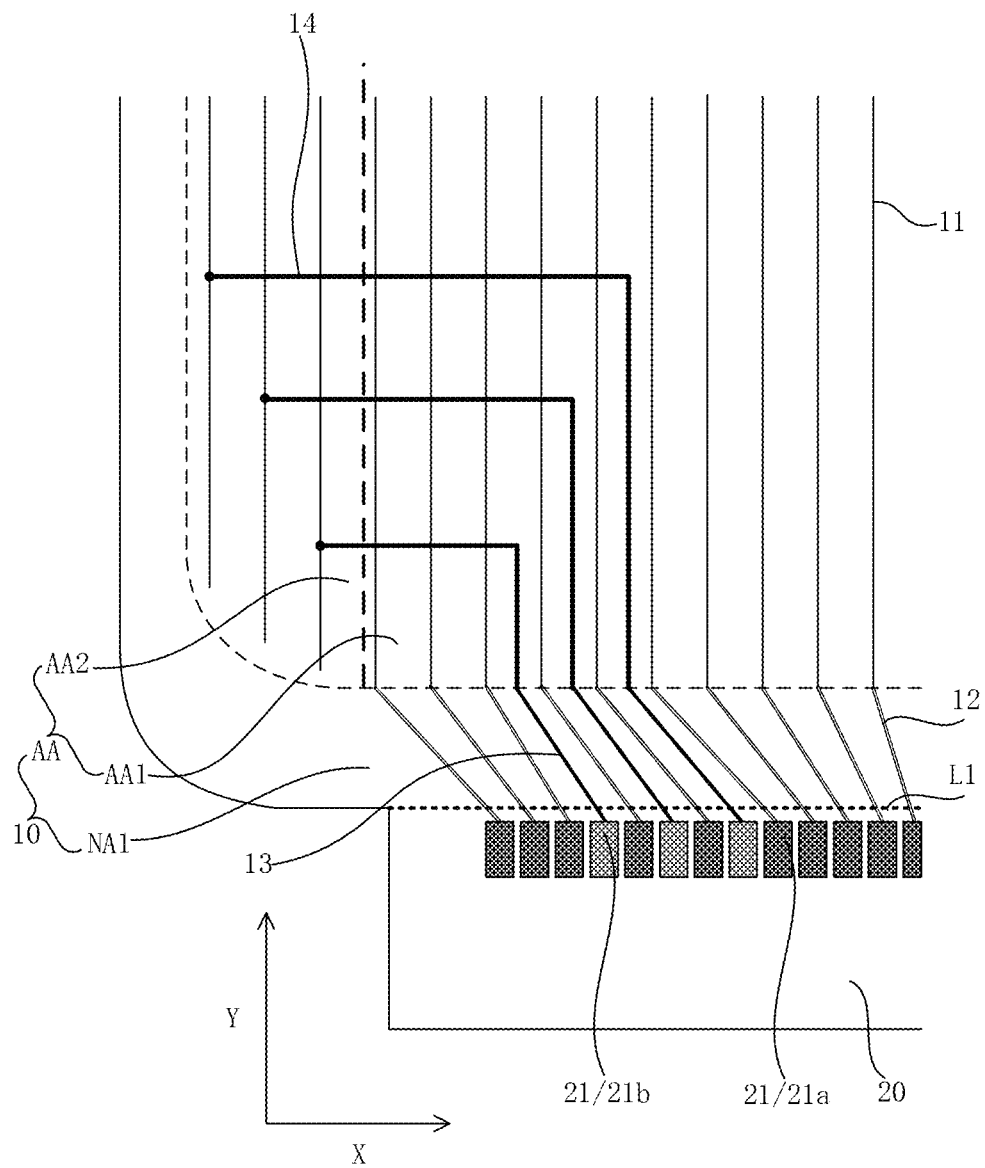
FIG. 12 is another partially enlarged view of a display panel according to an embodiment of the present disclosure.
Figure 13:
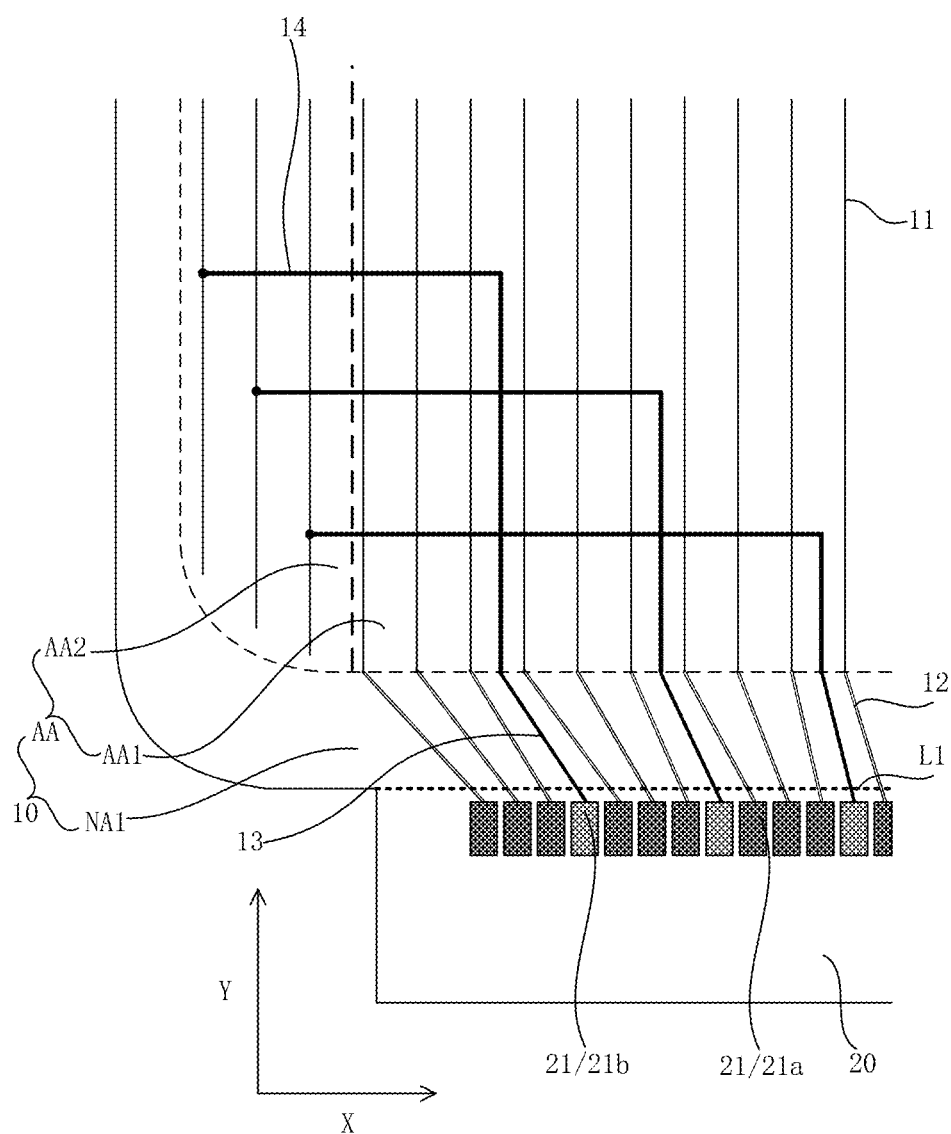
FIG. 13 is another partially enlarged view of a display panel according to an embodiment of the present disclosure.
Figure 14:
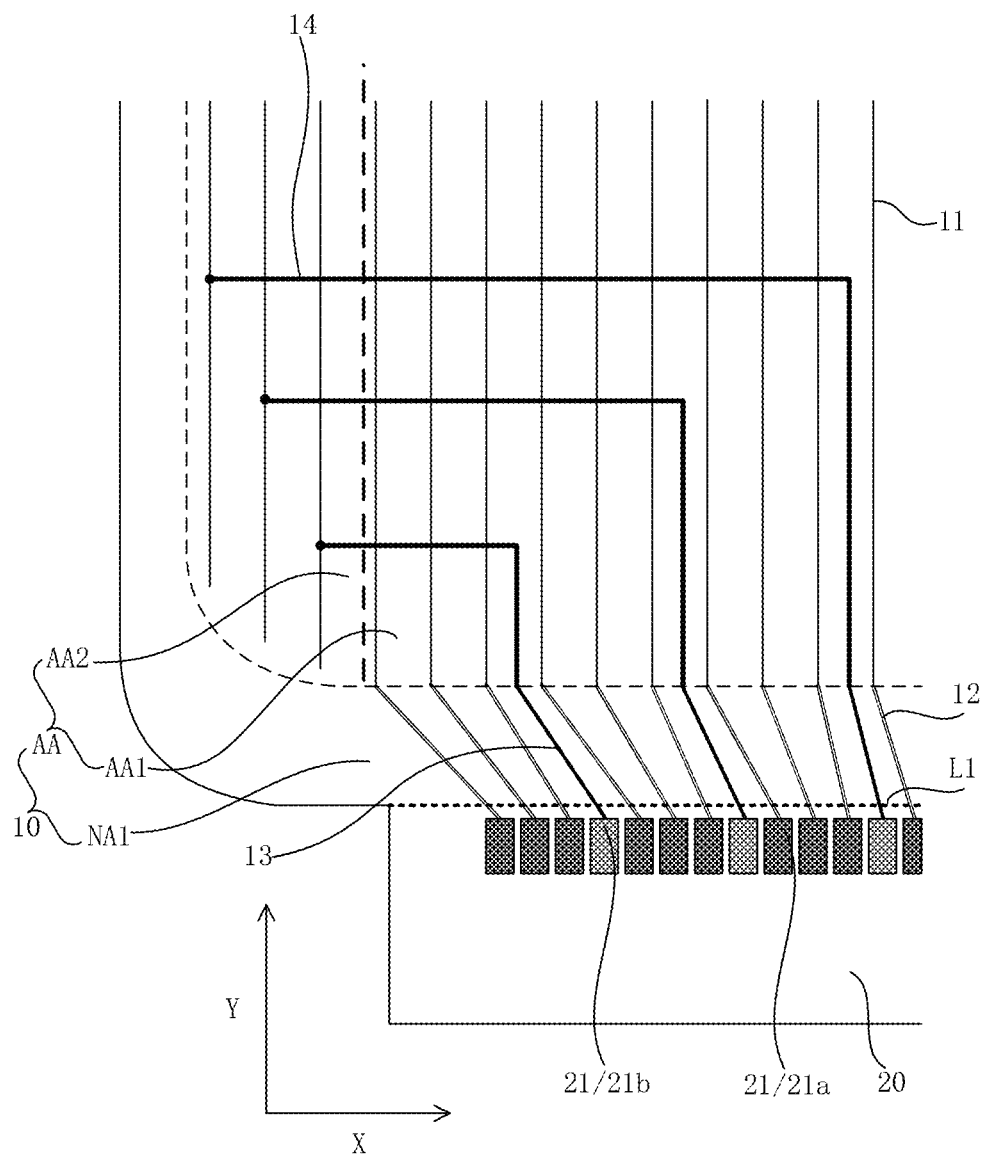
FIG. 14 is another partially enlarged view of a display panel according to an embodiment of the present disclosure.

FIG. 11 is a partially enlarged view of a display panel according to an embodiment of the present disclosure, FIG. 12 is another partially enlarged view of a display panel according to an embodiment of the present disclosure, FIG. 13 is another partially enlarged view of a display panel according to an embodiment of the present disclosure, and FIG. 14 is another partially enlarged view of a display panel according to an embodiment of the present disclosure.

As shown in FIG. 11 to FIG. 14, the second binding pins 21b and the first binding pins 21a are alternately arranged. That is, the second binding pins 21b can be located between first binding pins 21a adjacent to one another.

As shown in FIG. 14, the second signal line 13 does not overlap with the orthographic projection of the first signal line 12 along the thickness direction of the display panel, so that the second signal line 13 can be provided in a same layer as the first signal line 12, thereby avoiding difficulty of wiring in the first non-display region NA1.

Figure 15:
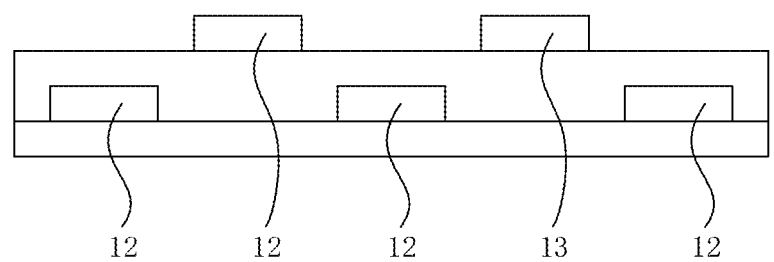
FIG. 15 is a schematic partial cross-sectional view of a first non-display region in FIG. 11 to FIG. 14 according to an embodiment of the present disclosure.

FIG. 15 is a schematic partial cross-sectional view of the first non-display region in FIG. 11 to FIG. 14 according to an embodiment of the present disclosure.

As shown in FIG. 15, due to a large number of first connecting lines 12, multiple first connecting lines 12 can be arranged in different layers. That is, some first connecting lines 12 are located in different conductive layers as other first connecting lines 12, so that etching accuracy of the first connecting lines 12 can be achieved, thereby avoiding short circuits between first connecting lines 12 adjacent to one another. Therefore, the conductive layer where the second connecting line 13 is located can be the same as one/another conductive layer where the first connecting lines 12 are located.

In an embodiment of the present disclosure, as shown in FIG. 13 and FIG. 14, N second binding pins 21b and M first binding pins 21a are repeatedly arranged along the first direction X as a minimum cycle. N and M are both positive integers greater than or equal to 1. That is, M first binding pins 21a can be included among at least two second binding pins 21b that are adjacent to one another, and N first binding pins 21a can be included between at least two second binding pins 21b that are adjacent to one another.

Figure 16:
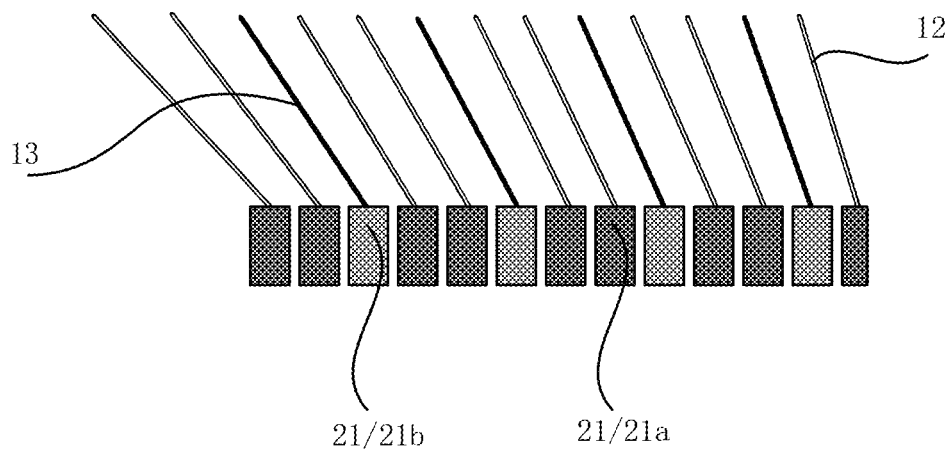
FIG. 16 is a schematic diagram showing arrangement of first connecting lines and second connecting lines in a display panel according to an embodiment of the present disclosure.
Figure 17:
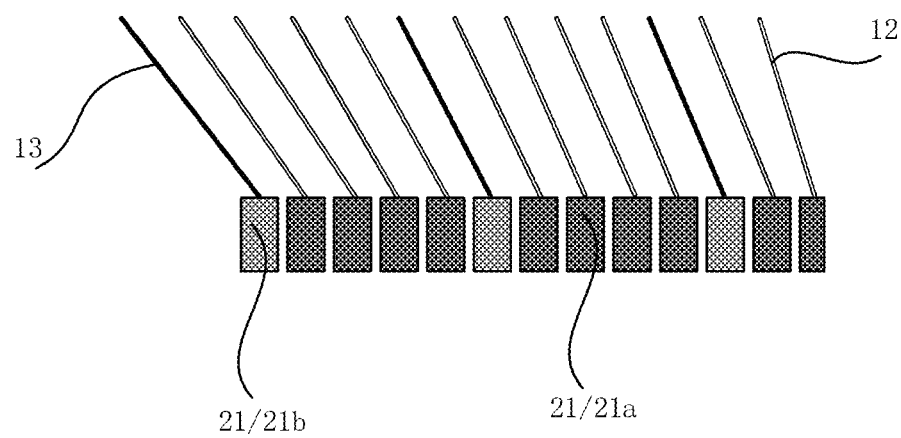
FIG. 17 is another schematic diagram showing arrangement of first connecting lines and second connecting lines in a display panel according to an embodiment of the present disclosure.

FIG. 16 is a schematic diagram showing an arrangement of first connecting lines and second connecting lines in a display panel according to an embodiment of the present disclosure, and FIG. 17 is another schematic diagram of an arrangement of first connecting lines and second connecting lines in a display panel according to an embodiment of the present disclosure.

In an embodiment of the present disclosure, as shown in FIG. 13 and FIG. 14, N=1 and M=3.

In an embodiment of the present disclosure, as shown in FIG. 16, N=1 and M=2.

In an embodiment of the present disclosure, as shown in FIG. 17, N=1 and M=4.

Figure 18:
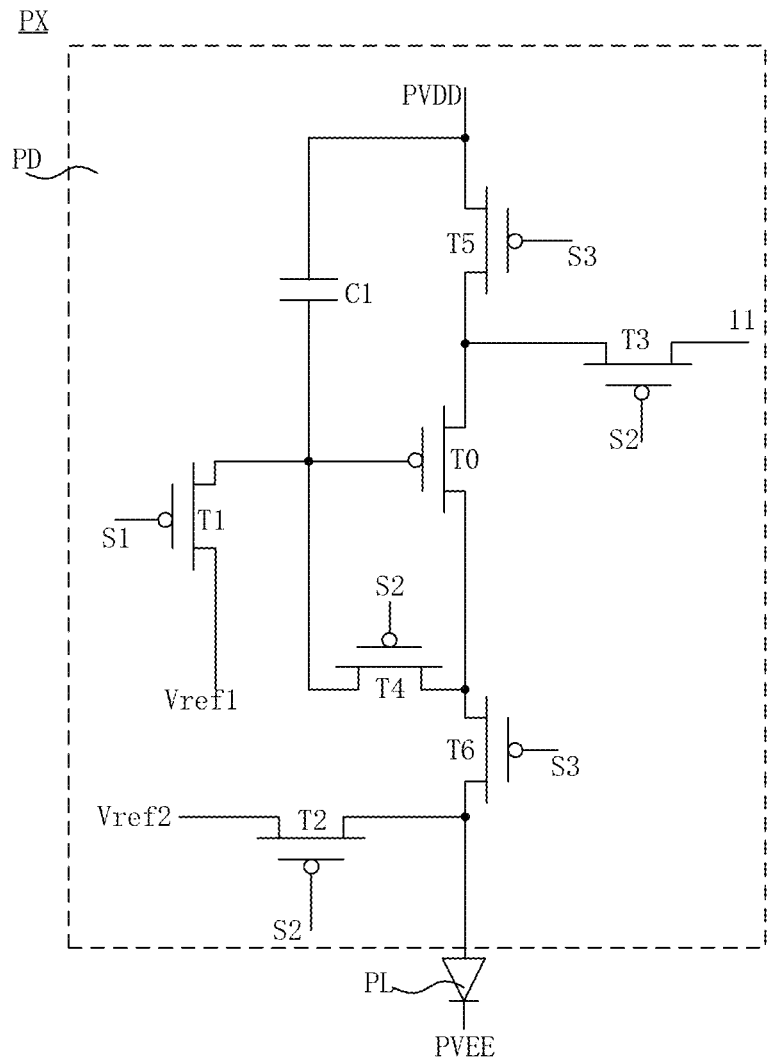
FIG. 18 is an equivalent circuit diagram of a light-emitting pixel according to an embodiment of the present disclosure.
Figure 19:
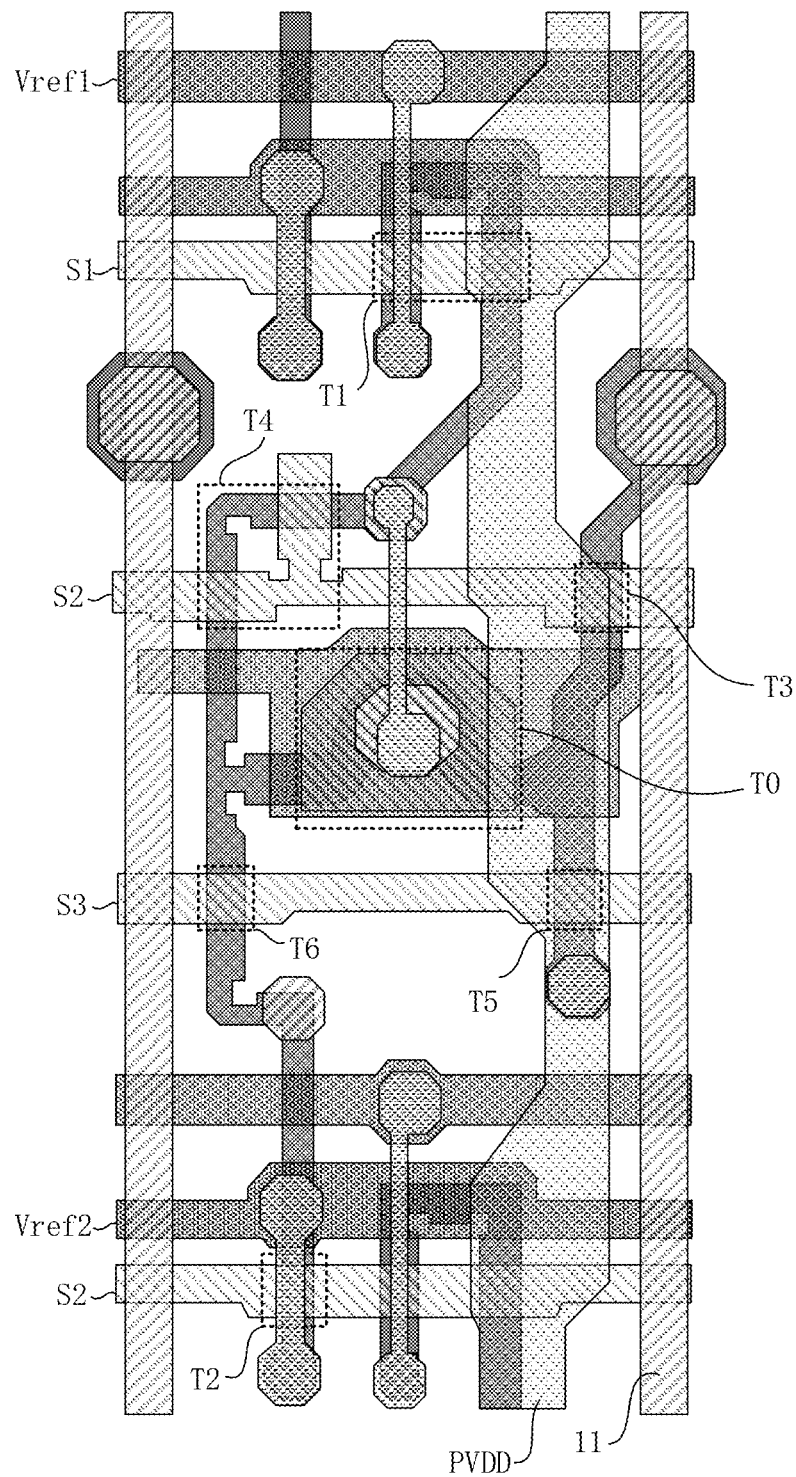
FIG. 19 is a schematic diagram of a layout of a pixel circuit according to an embodiment of the present disclosure.

FIG. 18 is an equivalent circuit diagram of a light-emitting pixel according to an embodiment of the present disclosure, and FIG. 19 is a schematic diagram of a layout of a pixel circuit according to an embodiment of the present disclosure.

Light-emitting pixels PX in the display region AA are configured to emit light to display. Referring to FIG. 18, the light-emitting pixel PX can include a pixel circuit PD and a light-emitting device PL. The light-emitting device PL can include an anode, a cathode, and a light-emitting material layer located between the anode and the cathode. One electrode of the pixel circuit PD can be connected to one of the anode and the cathode of the light-emitting device PL.

Referring to FIG. 18 and FIG. 19, the pixel circuit PD can include a light-emitting driving transistor T0, a first reset transistor T1, a second reset transistor T2, a data voltage writing transistor T3, a threshold grabbing transistor T4, a power voltage writing transistor T5, a light-emitting control transistor T6 and a storage capacitor C1.

The display region AA further includes a first signal line 11, scan lines S1, S2, S3 and a power voltage line PVDD.

One electrode plate of the storage capacitor C1 is electrically connected to a gate electrode of the light-emitting driving transistor T0, and the other electrode plate is electrically connected to a first electrode of the power voltage writing transistor T5.

A first electrode of the first reset transistor T1 is connected to a first reset signal line Vref1, a second electrode of the first reset transistor T1 is electrically connected to a gate electrode of the light-emitting driving transistor T0, and a control terminal of the first reset transistor T1 is electrically connected to the first scan line S1. The first reset transistor T1 is configured to reset the gate electrode of the light-emitting driving transistor T0.

A first electrode of the second reset transistor T2 is connected to the second reset signal line Vref2, a second electrode of the second reset transistor T2 is electrically connected to the light-emitting device PL, and a control terminal of the second reset transistor T2 is electrically connected to the second scan line S2. The second reset transistor T2 is configured to reset the anode or the cathode of the light-emitting device PL. The signals connected to the first reset signal line Vref1 and the second reset signal line Vref2 can be the same or different, which is not limited in the present disclosure.

A first electrode of the data voltage writing transistor T3 is connected to the first signal line 11, a second electrode of the data voltage writing transistor T3 is electrically connected to the first electrode of the light-emitting driving transistor T0, and a control terminal of the data voltage writing transistor T3 is electrically connected to the second scan line S2. A first electrode of the threshold grabbing transistor T4 is electrically connected to the second electrode of the light-emitting driving transistor T0, a second electrode of the threshold grabbing transistor T4 is electrically connected to the gate electrode of the light-emitting driving transistor T0, and a control terminal of the threshold grabbing transistor T4 is electrically connected to the second scan line S2. The data voltage writing transistor T3 matches with the threshold grabbing transistor T4 to write the data voltage transmitted by the first signal line 11 into the gate electrode of the light-emitting driving transistor T0.

A first electrode of the power voltage writing transistor T5 is connected to the power voltage line PVDD, a second electrode of the power voltage writing transistor T5 is electrically connected to the first electrode of the light-emitting driving transistor T0, and a control terminal of the power voltage writing transistor T5 is electrically connected to the third scan line S3. The power voltage writing transistor T5 is configured to write the power voltage into the first electrode of the light-emitting driving transistor T0.

A first electrode of the light-emitting control transistor T6 is electrically connected to the second electrode of the light-emitting driving transistor T0, a second electrode of the light-emitting control transistor T6 is electrically connected to the light-emitting device PL, and a control terminal of the light-emitting control transistor T6 is electrically connected to the third scan line S3. The light-emitting control transistor T6 is configured to transmit a light-emitting driving current generated by the light-emitting driving transistor T0 to the light-emitting device PL.

FIG. 18 and FIG. 19 only schematically show one structure of the pixel circuits, which can have other alternatives than those shown in FIG. 18 and FIG. 19.

Figure 20:
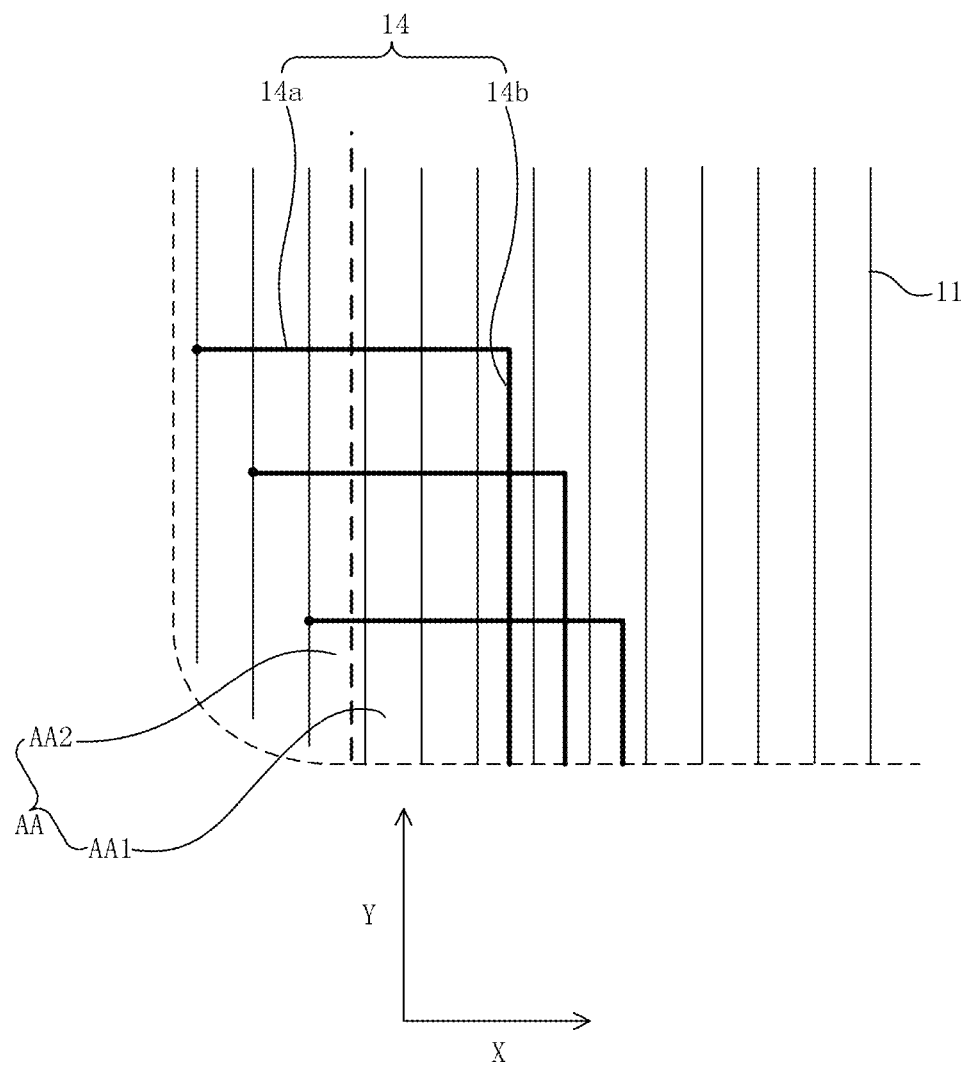
FIG. 20 is a partially enlarged view of a display region of a display panel according to an embodiment of the present disclosure.
Figure 21:
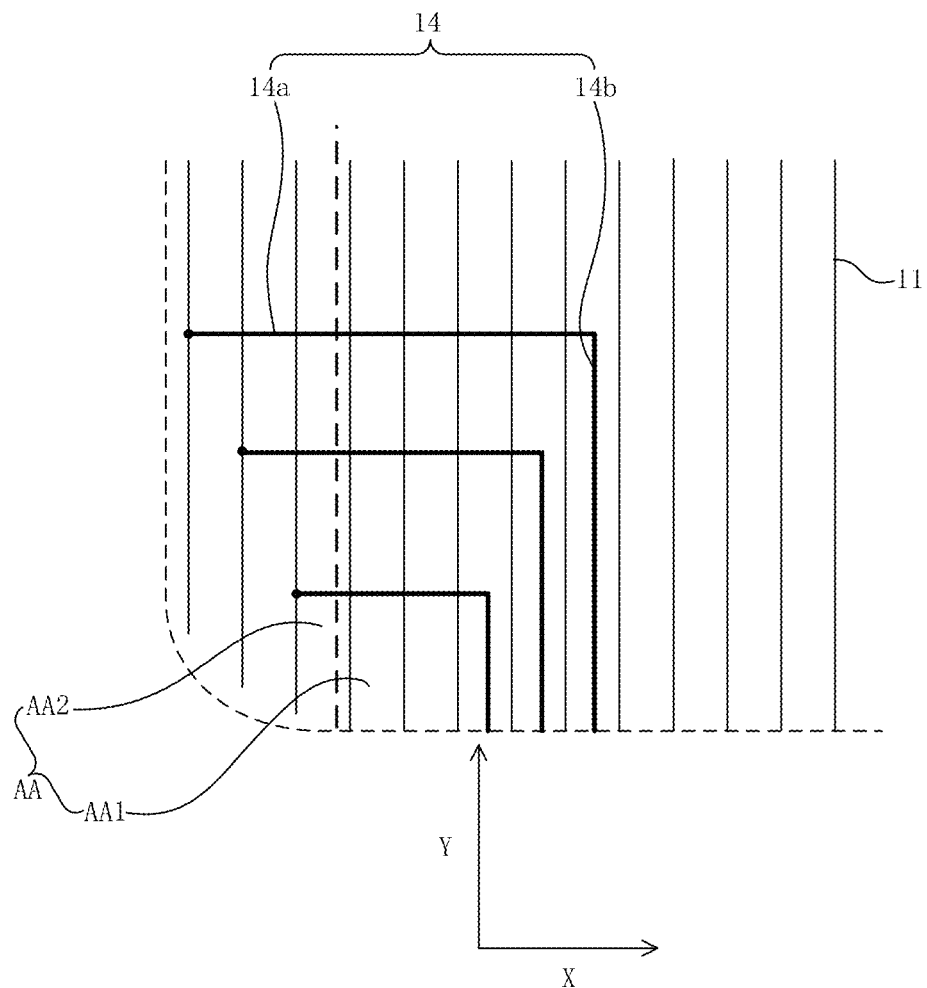
FIG. 21 is another partially enlarged view of a display region in a display panel according to an embodiment of the present disclosure.
Figure 22:
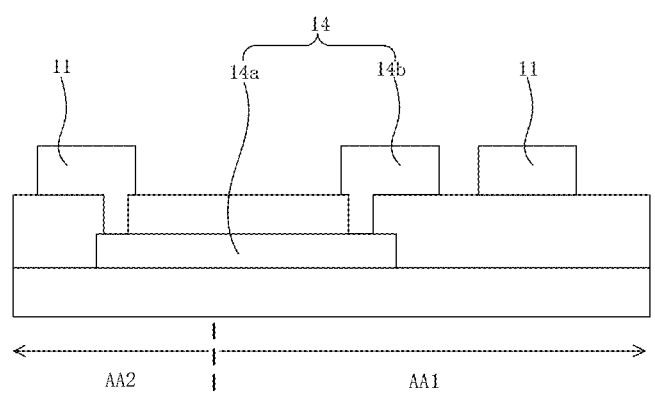
FIG. 22 is a partial cross-sectional schematic view of FIG. 20 and FIG. 21 according to an embodiment of the present disclosure.

FIG. 20 is a partially enlarged view of a display region of a display panel according to an embodiment of the present disclosure, FIG. 21 is another partially enlarged view of a display region in a display panel according to an embodiment of the present disclosure, and FIG. 22 is a partial cross-sectional schematic view of FIG. 20 and FIG. 21 according to an embodiment of the present disclosure.

As shown in FIG. 20, FIG. 21 and FIG. 22, the third connecting line 14 includes a first connecting sub-line 14a and a second connecting sub-line 14b that are electrically connected to each other. The first connecting sub-line 14a is provided in a different layer from the second connecting sub-line 14b.

The first connecting sub-line 14a is electrically connected to the first signal line 11 in the second display region AA2, the second connecting sub-line 14b is electrically connected to the second connecting line 13, the first connecting sub-line 14a and the second connecting sub-line 14b are located in different conductive layers. That is, the third connecting line 14 includes portions located in different conductive layers.

Multiple first connecting sub-lines 14a can be arranged along the second direction Y. Multiple second connecting sub-lines 14b can be arranged along the first direction X. Further, the third connecting lines 14 each includes the first connecting sub-line 14a extending generally along the first direction X and the second connecting sub-line 14b extending generally along the second direction Y.

In an embodiment of the present disclosure, the third connecting line 14 is designed as a jumper wire, so that at least some third connecting lines 14 can be provided in a same layer as signal lines of other functions in the display panel while avoiding electrical conduction of the signal lines of different functions, thereby avoiding increasing process steps, and thus saving costs.

Figure 23:
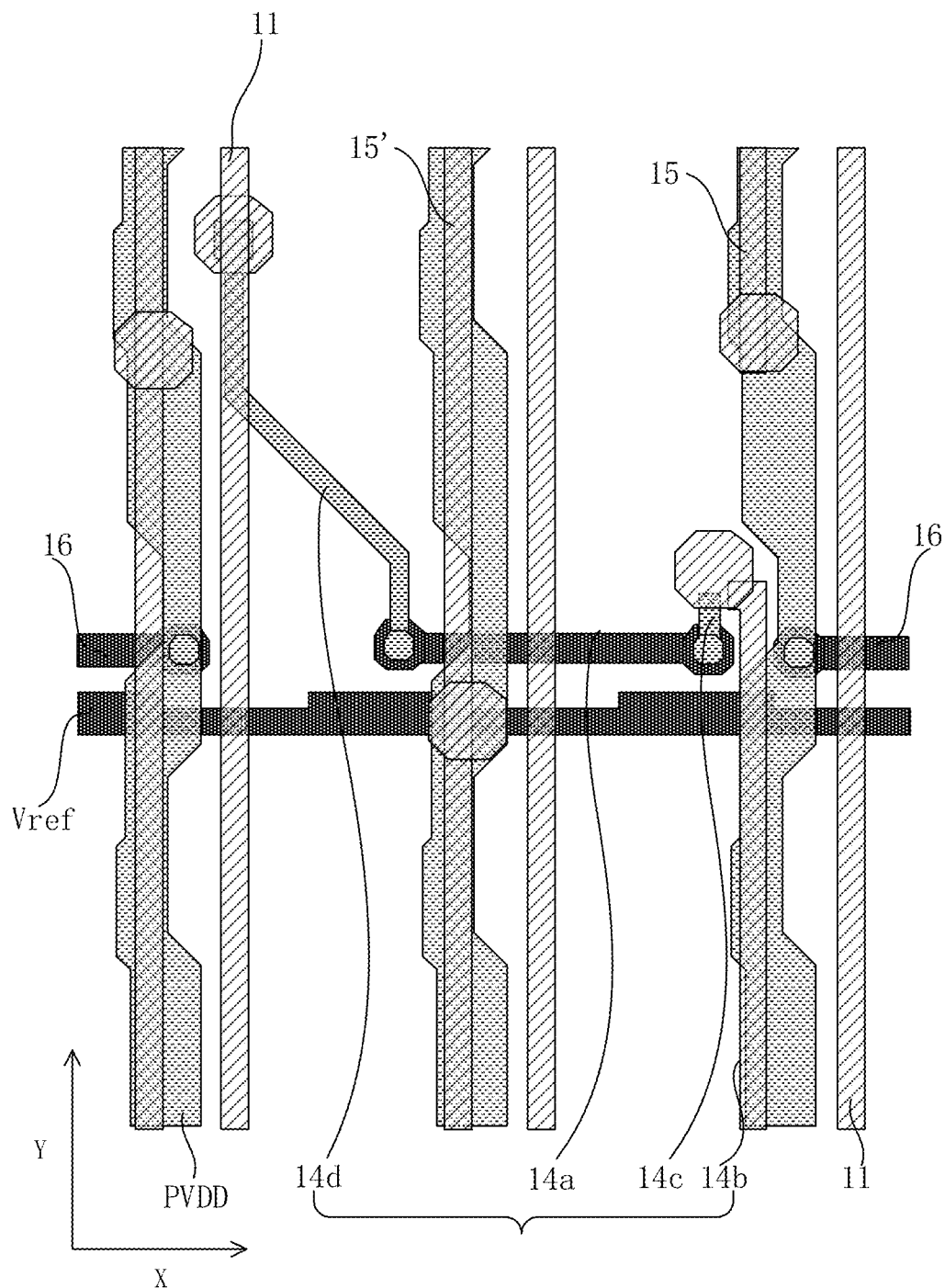
FIG. 23 is a partially enlarged view of a display panel according to an embodiment of the present disclosure.

In an embodiment of the present disclosure, as shown in FIG. 23, the second connecting sub-line 14b is provided in a same layer as the first signal line 11. As shown in FIG. 20 and FIG. 21, the second connecting sub-line 14b can have a same extending direction as the first signal line 11.

In an embodiment of the present disclosure, the first connecting sub-lines 14a are provided in different layers from the second connecting sub-lines 14b, so that the first connecting sub-lines 14a are provided in different layers from the first signal lines 11. By providing the second connecting sub-line 14b and the first signal line 11 in a same layer, the second connecting sub-line 14b can be manufactured while preparing the first signal line 11. By providing the first connecting sub-line 14a and the first signal line 11 in different layers, the first connecting sub-line 14a extending generally along the first direction X can be prevented from being electrically connected to the first signal line 11 extending along the second direction Y.

Figure 24:
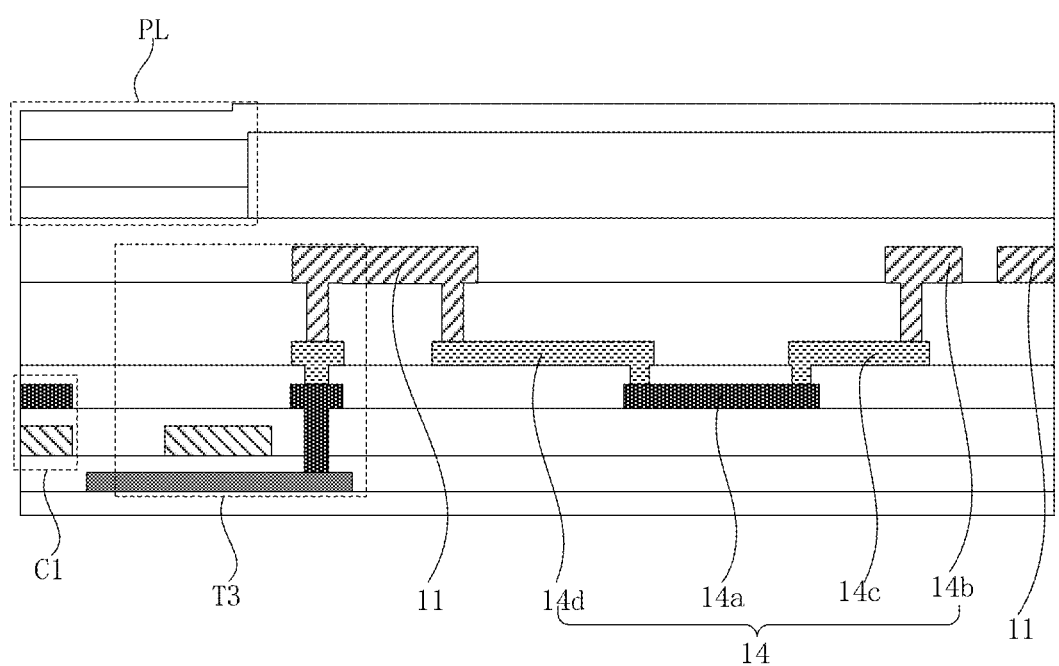
FIG. 24 is a partial cross-sectional view of a display region according to an embodiment of the present disclosure.

FIG. 23 is a partially enlarged view of a display panel according to an embodiment of the present disclosure, and FIG. 24 is a partial cross-sectional view of a display region according to an embodiment of the present disclosure. In order to clearly illustrate the connection manner between the first signal line 11 and the third connecting line 14, the layout shown in FIG. 23 only illustrates some related structures, which can be understood in conjunction with FIG. 23 and FIG. 21.

Referring to FIG. 23, in an embodiment of the present disclosure, the display region AA further includes a fourth connecting line 15. The fourth connecting line 15 is provided in a same layer as the second connecting sub-line 14b, and is insulated from the second connecting sub-line 14b. The fourth connecting line 15 and the second connecting sub-line 14b can be located in a conductive layer where the first signal line 11 is located.

The fourth connecting line 15 can be connected to the power voltage line PVDD to stabilize the signal transmitted by the power voltage line PVDD. The fourth connecting line 15 can also be floated.

In an embodiment of the present disclosure, the fourth connecting line 15 and the second connecting sub-line 14b can be arranged along the second direction Y and electrically insulated from each other. The fourth connecting line 15 is provided in different layers from and is electrically connected to the power voltage line PVDD.

In an embodiment of the present disclosure, in order to provide the third connecting line 14, the second connecting sub-line 14b constituting the third connecting line 14 is provided on a conductive layer where the first signal line 11 is located. Referring to FIG. 20, FIG. 22, and FIG. 23, the second connecting sub-line 14b extends from a position where the first connecting sub-line 14a and the second connecting sub-line 14b are connected, to the rear folding portion 20. That is, when the second connecting sub-line 14b is manufactured, the fourth connecting line 15 that is in the same layer and straight line as the second connecting sub-line 14b and electrically insulated from the second connecting sub-line 14b can be manufactured synchronously.

Referring to FIG. 23, the first signal line 11 and the power voltage line PVDD can be provided in different layers to meet high resolution requirement of the display panel. At this time, the layer where the first signal line 11 is located can be provided with a first voltage stabilization signal line 15' electrically connected to the power voltage line PVDD. The first voltage stabilization signal line 15' can be in a same layer as the first signal line 11. The second connecting sub-line 14b and the fourth connecting line 15 can be formed during the process for manufacturing the first voltage stabilization signal line 15'. A via hole between the fourth connecting line 15 and the power voltage line PVDD can be formed synchronously with a via hole between the voltage signal line 15' and the power voltage line PVDD.

In an embodiment of the present disclosure, as shown in FIG. 23 and FIG. 24, at least a part of the first connecting sub-line 14a is provided in a same layer as a reset signal line Vref. As shown in FIG. 23 and FIG. 24, the part of the first connecting sub-line 14a at a same layer as the reset signal line Vref can have a same extending direction as the reset signal line Vref. The reset signal line Vref includes the first reset signal line Vref1 and the second reset signal line Vref2.

By arranging the first connecting sub-line 14a and the reset signal line Vref in a same layer, the first connecting sub-line 14a can be manufactured synchronously as the reset signal line Vref.

Referring to FIG. 23 and FIG. 24, in an embodiment of the present disclosure, the display region AA further includes a fifth connecting line 16. The fifth connecting line 16 is provided in a same layer as the first connecting sub-line 14a and insulated from the first connecting sub-line 14a. The fifth connecting line 16 and the first connecting sub-line 14a can be provided in a same layer as the conductive layer where the reset signal line Vref is located.

The fifth connecting line 16 can be connected to the power voltage line PVDD to stabilize the signal transmitted by the power voltage line PVDD. The fifth connecting line 16 can be floated.

In an embodiment of the present disclosure, the fifth connecting line 16 and the first connecting sub-line 14a can be arranged along the first direction X and electrically insulated from each other. The fifth connecting line 16 and the power voltage line PVDD are provided in different layers and electrically connected to each other.

In order to arrange the third connecting lines 14, first connecting sub-lines 14a constituting the third connecting line 14 are provided in a conductive layer where the reset signal line Vref is located. Referring to FIG. 23, when the first connecting sub-line 14a is manufactured, a fifth connecting line 16, which is located on the same straight line and in a same layer as the first connecting sub-line 14a and electrically insulated from the first connecting sub-line 14a, can be manufactured synchronously.

A layer where the reset signal line Vref is located can be provided with a second voltage stabilization signal line 16' electrically connected to the power voltage line PVDD. The second voltage stabilization signal line 16' can be in a same layer as the reset signal line Vref. The first connecting sub-line 14a and the fifth connecting line 16 can be formed during a process for manufacturing the second voltage stabilization signal line 16'. A via hole between the fifth connecting line 16 and the power voltage line PVDD can be formed synchronously with a via hole between the second voltage stabilization signal line 16' and the power voltage line PVDD.

In an embodiment of the present disclosure, as shown in FIG. 23 and FIG. 24, the third connecting line 14 can further include a first bridge portion 14c that is provided at a same layer as the power voltage line PVDD. The first connecting sub-line 14a is electrically connected to the second connecting sub-line 14b through the first bridge portion 14c.

In an embodiment of the present disclosure, as shown in FIG. 23 and FIG. 24, the third connecting line 14 can further include a second bridge portion 14d that is provided at a same layer as the power voltage line PVDD. The first connecting sub-line 14a is electrically connected to the first signal line 11 in the second display region AA2 through the second bridge portion 14d.

A conductive layer where the power voltage line PVDD is located is located between a conductive layer where the reset signal line Vref is located and a conductive layer where the first signal line 11 is located. The power voltage lines PVDD are arranged along the first direction X and extend in the second direction Y. The first connecting sub-line 14a for connecting the first signal line 11 and the second connecting sub-line 14b in the same conductive layer is located in a different layer from the first signal line 11, which can avoid an undesired electrical conduction with the first signal line 11. The third connecting line 14 includes the first bridging portion 14c and the second bridging portion 14d, so that the risk of wire breakage between the first signal line 11 and the connecting line in the conductive layer farther from the first signal line 11 can be avoided.

Referring to FIG. 23 and FIG. 24, the first signal line 11 in the second display region AA2 is connected to the second bridge portion 14d. Since a conductive layer where the first signal line 11 is located is relatively close to a conductive layer where the second bridge portion 14d is located, the risk of wire breakage between them is extremely low. In addition, the second bridge portion 14d is connected to the first connecting sub-line 14a. Since a conductive layer where the first connecting sub-line 14a is located is relatively close to a conductive layer where the second bridge portion 14d is located, the risk of wire breakage between them is extremely low. The first connecting sub-line 14a is the part of the first connecting sub-line 14a mainly extending along the first direction X, so that the conductive layer where the first connecting sub-line 14a is located is different from any one of conductive layers where the power voltage line PVDD and the first signal line 11 are located, thereby achieving electrically insulation between the first connecting sub-line 14a and the power voltage line PVDD, the first signal line 11. In an embodiment of the present disclosure, the first connecting sub-line 14a is connected to the second connecting sub-line 14b through the first bridge portion 14c.

Referring to FIG. 20, FIG. 21 and FIG. 23, when the first connecting sub-line 14a, the second connecting sub-line 14, the first bridge portion 14c and the second bridge portion 14d in the third connecting line 14 are located in a same layer as other signal lines in the display region AA, among the first connecting sub-lines 14a and second connecting sub-lines 14b that are electrically connected to each other, the minimum angle between the first connecting sub-line 14a and the second connecting sub-line 14b is 90°.

Figure 25:
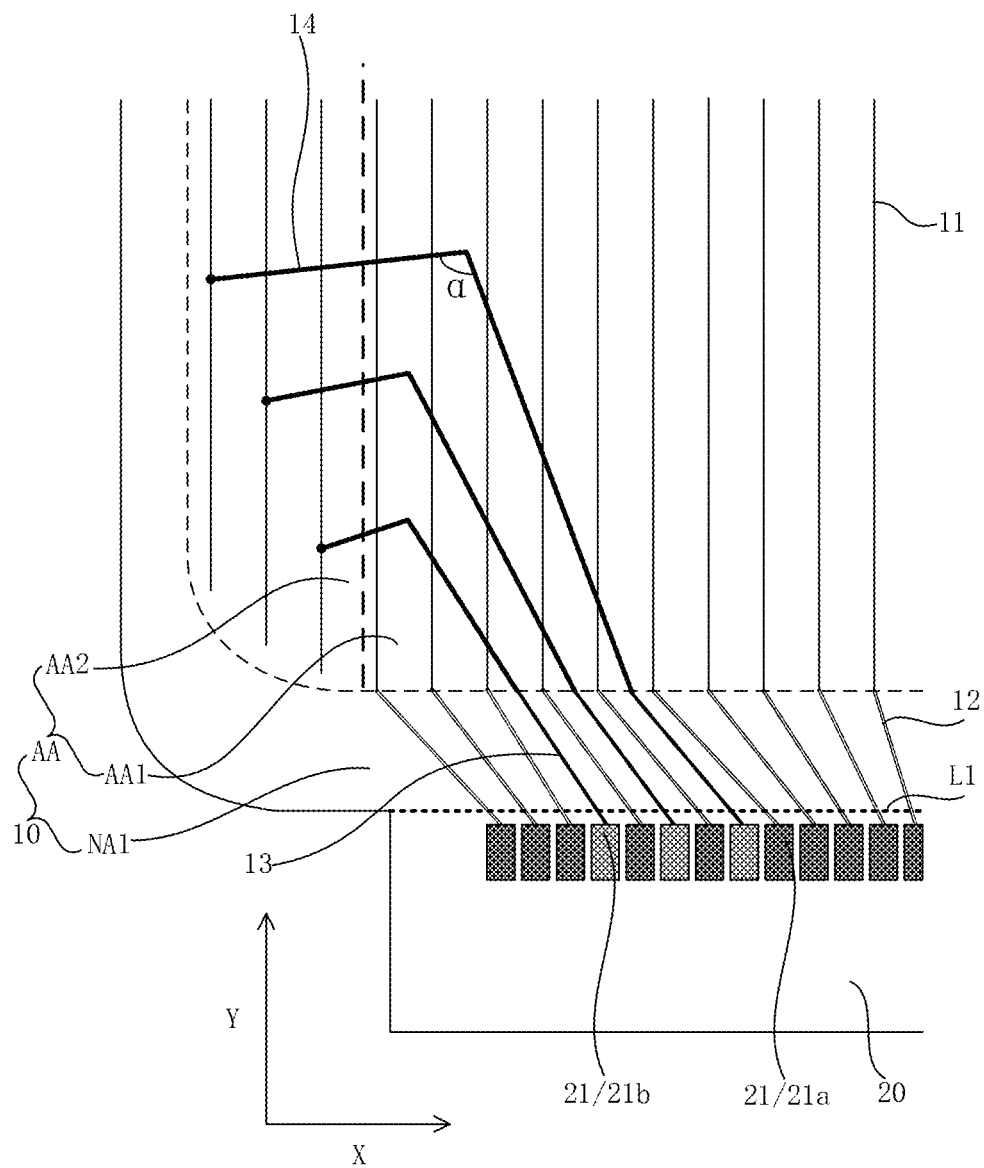
FIG. 25 is a partially enlarged view of a display panel according to an embodiment of the present disclosure.
Figure 26:
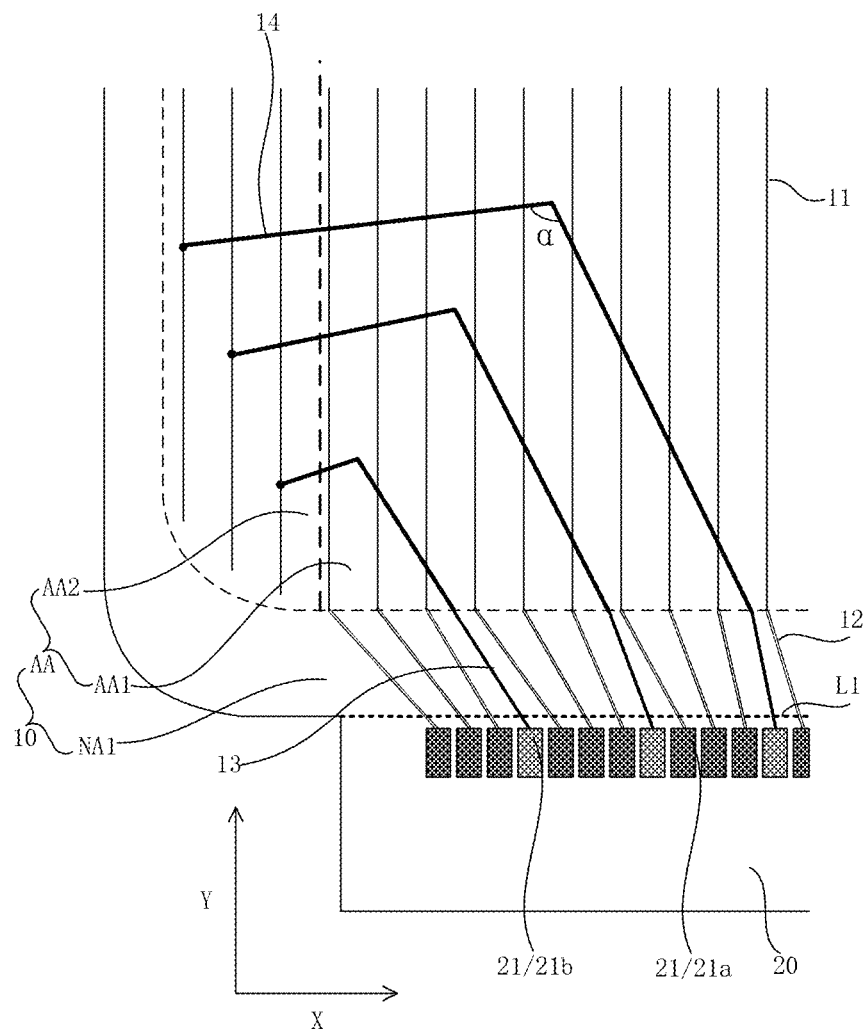
FIG. 26 is another partially enlarged view of a display panel according to an embodiment of the present disclosure.
Figure 27:
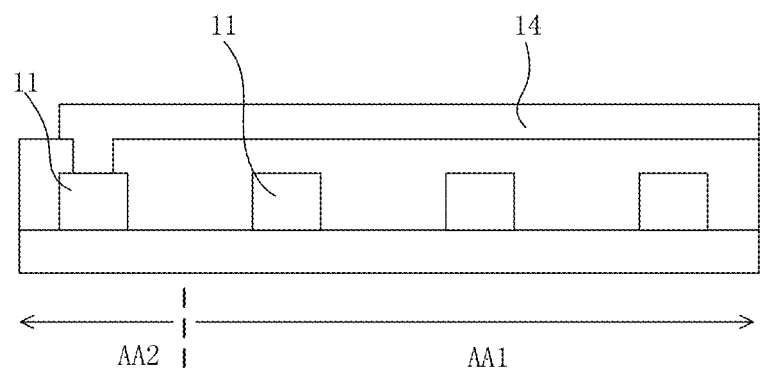
FIG. 27 is a partial cross-sectional view of the display region shown in FIG. 25 and FIG. 26 according to an embodiment of the present disclosure.

FIG. 25 is a partially enlarged view of a display panel according to an embodiment of the present disclosure, FIG. 26 is another partially enlarged view of a display panel according to an embodiment of the present disclosure, and FIG. 27 is a partial cross-sectional view of the display region shown in FIG. 25 and FIG. 26.

In an embodiment of the present disclosure, referring to FIG. 25, FIG. 26, and FIG. 27, parts of the third connecting line 14 are located in a same layer. The third connecting line 14 is provided in a different layer from the first signal line 11. The third connecting line 14 can be provided in a different layer from each one of the scan lines S1, S2, S3, the power voltage line PVDD, and the reset signal line Vref.

The layer where the third connecting line 14 is located can further include a voltage stabilizing signal line electrically connected to the power voltage line PVDD.

In an embodiment of the present disclosure, the third connecting line 14 is a folded line structure, and has a folding angle $\alpha$ satisfying $\alpha \geq 90°$. Therefore, the third connecting line 14 can have an excellent etching yield.

As shown in FIGS. 6-9 and 11-14, the third connection wire 14 has a first end connected to the first signal line 11, and a second end electrically connected to the second connection wire 13. That is, an end of the third connecting line 14 located in the second display region AA2 and connected to the first signal line 11 is the first end, and an end of the third connecting line 14 located in the first display region AA1 and electrically connected to the second signal line 13 is the second end.

In an embodiment of the present disclosure, as shown in FIG. 6, FIG. 8, FIG. 11, FIG. 13, and FIG. 20, among the first ends and the second ends of multiple third connecting lines 14, an arrangement sequence of multiple first ends along the first direction X is same as an arrangement sequence of multiple second ends corresponding to the first ends along the first direction X.

In addition, among the first signal lines 11 and the second binding pins 21b electrically connected thereto in the second display region AA2, an arrangement sequence of multiple first signal lines 11 along the first direction X is the same an arrangement sequence of the electrically connected pins 21b corresponding to multiple first signal lines 11 along the first direction X.

For example, as shown in FIG. 6, FIG. 8, FIG. 11, and FIG. 13, the leftmost first signal line 11 in the second display region AA2 is located at the leftmost side of all second binding pins 21b through the third connecting line 14 and the second binding pins 21b electrically connected to the second connecting line 13. Similarly, the rightmost first signal line 11 in the second display region AA2 is located at the rightmost side of all second binding pins 21b through the third connecting line 14 and the second binding pins 21b electrically connected to the second connecting line 13.

In an embodiment of the present disclosure, as shown in FIG. 6 and FIG. 8, when an arrangement sequence of the first signal lines 11 in the second display region AA2 along the first direction X is same as an arrangement sequence of the binding pins 21b electrically connected thereto along the first direction X, multiple second binding pins 21b can be concentrated, so that the chips bound to the display panel or integrated with the flexible circuit bound do not need to be changed to much.

In an embodiment of the present disclosure, as shown in FIG. 11 and FIG. 13, when an arrangement sequence of the first signal lines 11 in the second display region AA2 along the first direction X is same as an arrangement sequence of the binding pins 21b electrically connected thereto along the first direction X, the second binding pins 21b and the first binding pins 21a can be arranged alternately. As a result, algorithms of the chips bound to the display panel or integrated with the flexible circuit bound are changed accordingly.

In an embodiment of the present disclosure, the first connecting sub-line 14a and the second connecting sub-line 14b in the third connecting line 14 are arranged in different layers, and the arrangement manners thereof are as described in the above embodiments, which will not be elaborated herein.

In an embodiment of the present disclosure, as shown in FIG. 7, FIG. 9, FIG. 12, FIG. 14, and FIG. 21, among the first ends and the second ends of multiple third connecting lines 14, an arrangement sequence of multiple first ends along the first direction X is reversed relative to an arrangement sequence of the corresponding multiple second ends along the first direction X.

In addition, among the first signal lines 11 in the second display region AA2 and the second binding pins 21b electrically connected thereto, an arrangement sequence of multiple first signal lines 11 along the first direction X is reversed relative to an arrangement sequence of the second binding pins 21b along the first direction X electrically connected correspondingly.

For example, as shown in FIG. 7, FIG. 9, FIG. 12, and FIG. 14, the leftmost first signal line 11 in the second display region AA2 is located at the rightmost side of all second binding pins 21b through the third connecting line 14 and the second binding pins 21b electrically connected to the second connecting line 13. Similarly, the rightmost first signal line 11 in the second display region AA2 is located at the leftmost side of all second binding pins 21b through the third connecting line 14 and the second binding pins 21b electrically connected to the second connecting line 13.

In an embodiment of the present disclosure, as shown in FIG. 7 and FIG. 9, when an arrangement sequence of the first signal lines 11 in the second display region AA2 along the first direction X is reversed relative to an arrangement sequence of the binding pins 21b electrically connected thereto along the first direction X, multiple second binding pins 21b can be concentrated, algorithms of the chips bound to the display panel or integrated with the flexible circuit bound are changed accordingly.

In an embodiment of the present disclosure, as shown in FIG. 11 and FIG. 13, when an arrangement sequence of the first signal lines 11 in the second display region AA2 along the first direction X is reversed relative to an arrangement sequence of the binding pins 21b electrically connected thereto along the first direction X, the second binding pins 21b and the first binding pins 21a can be arranged alternately. As a result, algorithms of the chips bound to the display panel or integrated with the flexible circuit bound are changed accordingly.

In an embodiment of the present disclosure, the first connecting sub-line 14a and the second connecting sub-line 14b of the third connecting line 14 can be arranged in different layers, and the arrangement manners thereof are as described in the above embodiments, which will not be elaborated herein.

In an embodiment of the present disclosure, parts of the third connecting line 14 can be provided in a same layer, and the arrangement manners thereof are as described in the above embodiments, which will not be elaborated herein.

Figure 28:
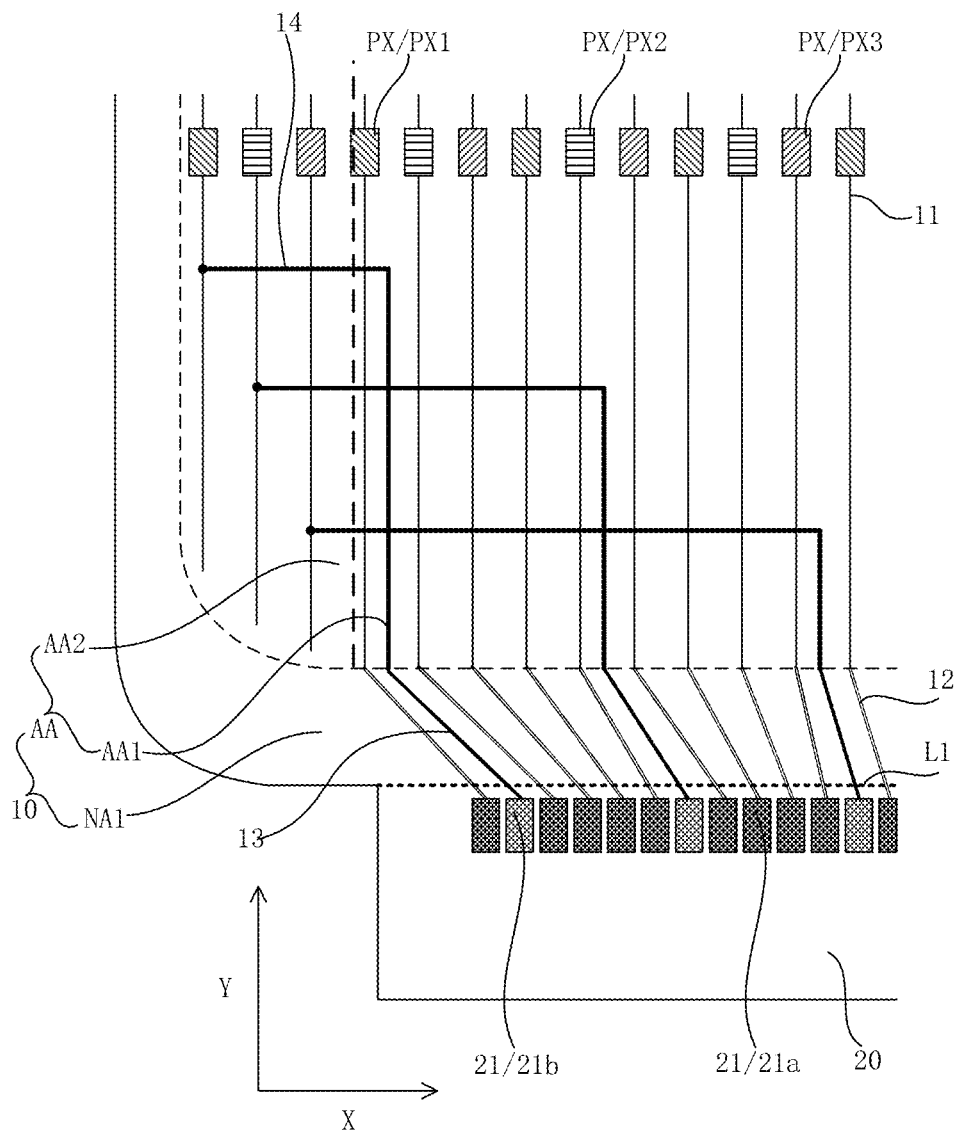
FIG. 28 is a partially enlarged view of a display panel according to an embodiment of the present disclosure.
Figure 29:
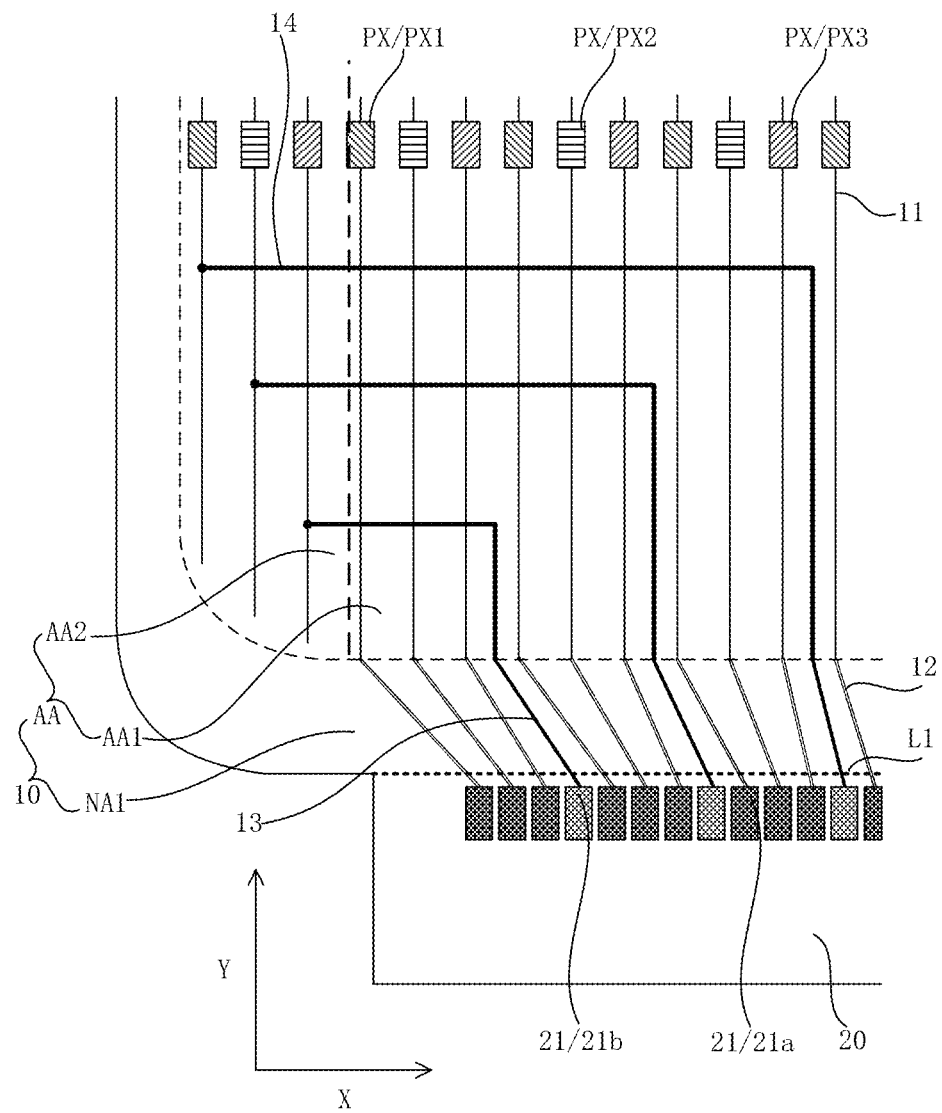
FIG. 29 is another partially enlarged view of a display panel according to an embodiment of the present disclosure.

FIG. 28 is a partially enlarged view of a display panel according to an embodiment of the present disclosure, and FIG. 29 is another partially enlarged view of a display panel according to an embodiment of the present disclosure.

As shown in FIG. 28 and FIG. 29, the display region AA includes at least two light-emitting pixels PX of different colors. For example, FIG. 28 and FIG. 29 show first-color light-emitting pixels PX1, second-color light-emitting pixels PX2 and third-color light-emitting pixels PX3.

In an embodiment of the present disclosure, as shown in FIG. 28 and FIG. 29, the first signal line 11 in the first display region AA1 includes a third end that is electrically connected to the first connecting line 12. Among the second end and the third end adjacent to the second end, the first signal lines 11 electrically connected to the second end and the third end are electrically connected to the light-emitting pixels PX of different color. On the one hand, the interference between the signals required by the light-emitting pixels PX of different colors is avoided; and on the other hand, the ramping speed of the signal transmitted by the first signal line 11 is accelerated.

In an embodiment of the present disclosure, as shown in FIG. 28 and FIG. 29, among the second connecting line 13 and a first connecting line 12 adjacent to the second connecting line 13, the first signal lines 11 electrically connected to the second connecting line 13 and the first connecting line 12 are electrically connected to the light-emitting pixels PX of the same color. On the one hand, the interference between the signals required by the light-emitting pixels PX of different colors is avoided; and on the other hand, the ramping speed of the signal transmitted by the first signal line 11 is accelerated.

In an embodiment of the present disclosure, as shown in FIG. 28 and FIG. 29, in the second binding pin 21b and the first binding pin 21a adjacent to the second binding pin 21b, the first signal lines electrically connected to the second binding pin 21b and the first binding pin 21a are electrically connected to the light-emitting pixels PX of the same color. On the one hand, the interference between the signals required by the light-emitting pixels PX of different colors is avoided; and on the other hand, the ramping speed of the signal transmitted by the first signal line 11 is accelerated.

Figure 30:
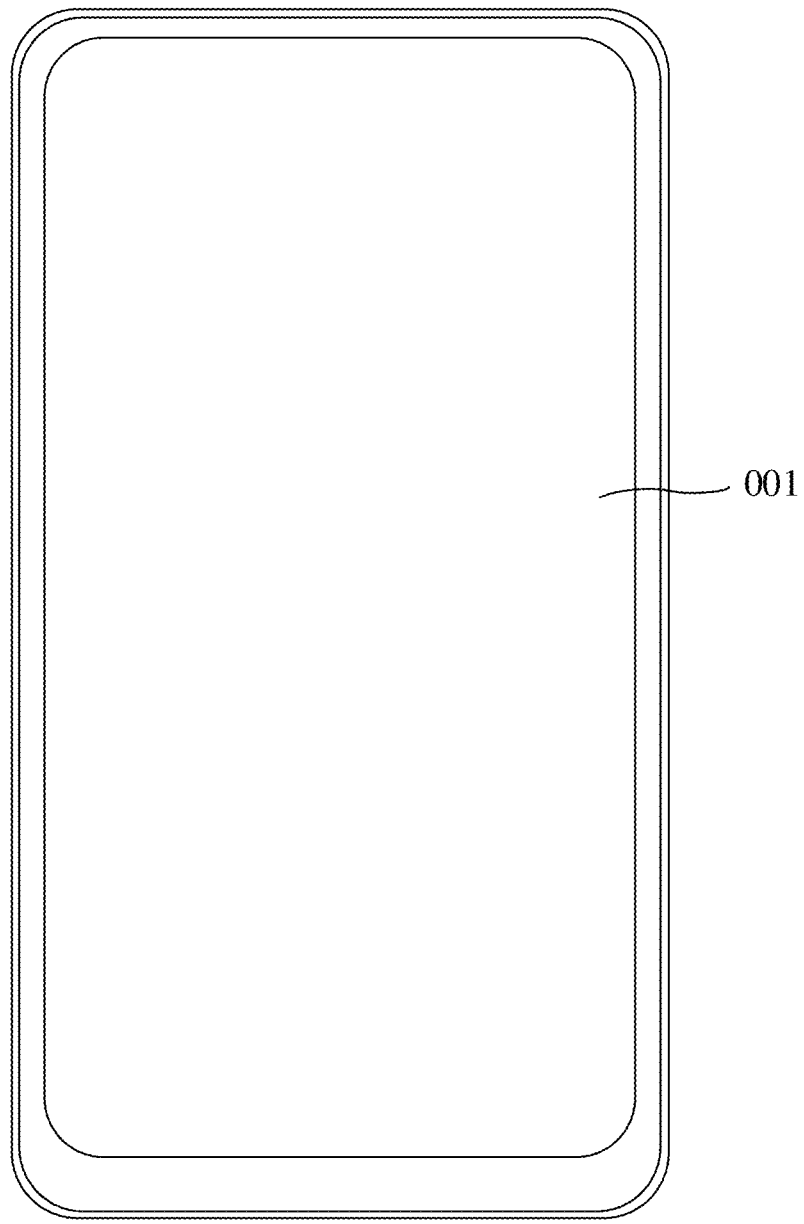
FIG. 30 is a schematic diagram of a display apparatus according to an embodiment of the present disclosure.

FIG. 30 is a schematic diagram of a display apparatus according to an embodiment of the present disclosure.

In an embodiment of the present disclosure, a display apparatus is provided. As shown in FIG. 30, the display apparatus includes the display panel 001 in any one of the above embodiments. The display apparatus can be a mobile phone, a computer or a TV.

In the present disclosure, the display panel included in the display apparatus is provided with the rear folding portion including binding pins, and the width of the rear folding portion along the first direction is within a certain range, so that a four-curved screen or double-curved screen can be achieved in the display apparatus. In addition, the lightness and thinness of the display apparatus is achieved, so that it is beneficial to improve the yield rate when modules are assembled, thereby reducing the binding stress between the rear folding portion and the chip or the flexible circuit board.

The above are merely embodiments of the present disclosure, which, as mentioned above, are not intended to limit the present disclosure. Within the principles of the present disclosure, any modification, equivalent substitution, improvement shall fall into the protection scope of the present disclosure.

What is claimed is:

1. A display panel, comprising:
a main body comprising a display region; and a rear folding portion comprising a plurality of binding pins, wherein the rear folding portion is bendable, and at least a part of the rear folding portion is configured to fold back to a side of a backlight surface of the main body;

wherein an edge of the rear folding portion that is connected to the main body is a first edge, and the first edge extends along a first direction;

wherein the main body comprises two second edges arranged opposite to each other along the first direction; and wherein a vertical distance between an endpoint of the first edge and a line where one of the second edges most adjacent to the endpoint is located is a first distance d1, and a minimum distance between the two second edges along the first direction is a second distance d2, and $0.025 \leq d1/d2 \leq 0.25$.

2. The display panel according to claim 1, wherein $0.06 \leq d1/d2 \leq 0.12$.

3. The display panel according to claim 1, wherein $0.09 \leq d1/d2 \leq 0.19$.

4. The display panel according to claim 1, wherein $d1 \geq 3.5$ mm.

5. The display panel according to claim 4, wherein 13 mm $\geq d1 \geq 7$ mm.

6. The display panel according to claim 5, wherein a value of d1 is selected from 8 mm, 9 mm, 11 mm, or 13 mm.

7. The display panel according to claim 1, wherein the rear folding portion further comprises a third edge arranged opposite to the first edge along a second direction and having a greater length than the first edge, and the second direction intersects with the first direction.

8. The display panel according to claim 1, wherein the rear folding portion further comprises a third edge arranged opposite to the first edge along a second direction and having a smaller length than the first edge, wherein the second direction intersects with the first direction.

9. The display panel according to claim 1, wherein the display region comprises a first display region and a second display region, the second display region is located at a side of the first display region adjacent to the second edge, and the main body further comprises a first non-display region located at a side of the display region close to the rear folding portion;

wherein each of the first display region and the second display region comprises first signal lines extending along a second direction and arranged along the first direction; the first non-display region further comprises a first connecting line and a second connecting line, the first signal line in the first display region is electrically connected to the plurality of binding pins through the first connecting line, and the second direction intersects with the first direction;

wherein the display region further comprises a third connecting line extending from the second display region to the first display region; and wherein the first signal line in the second display region is electrically connected to the plurality of binding pins through the second connecting line and the third connecting line.

10. The display panel according to claim 9, wherein, along the second direction, the first edge is covered by the first display region.

11. The display panel according to claim 9, wherein, along the second direction, the first edge overlaps with the second display region.

12. The display panel according to claim 9, wherein, along the second direction, at least a part of a side of the second display region adjacent to the first non-display region retracts relative to a side of the first display region adjacent to the first non-display region and retracts in a direction away from the first non-display region.

13. The display panel according to claim 9, wherein the plurality of binding pins arranged in the rear folding portion comprises a plurality of first binding pins and a plurality of second binding pins, the plurality of first binding pins is electrically connected to the first connecting line, and the plurality of second binding pins is electrically connected to the second connecting line; and wherein the plurality of first binding pins is arranged in sequence, and the plurality of second binding pins is arranged in sequence.

14. The display panel according to claim 9, wherein the plurality of binding pins arranged in the rear folding portion comprises a plurality of first binding pins and a plurality of second binding pins, the plurality of first binding pins is electrically connected to the first connecting line, and the plurality of second binding pins is electrically connected to the second connecting line; and wherein the plurality of first binding pins and the plurality of second binding pins are alternately arranged.

15. The display panel according to claim 14, wherein N second binding pins of the plurality of second binding pins and M first binding pins of the first plurality of binding pins, as a minimum cycle, are repeatedly arranged along the first direction, and N and M are both positive integers greater than or equal to 1.

16. The display panel according to claim 14, wherein the display region comprises at least two light-emitting pixels of different colors; and wherein, for a second binding pin of the plurality of second binding pins and an adjacent first binding pin of the plurality of first binding pins, the first signal line to which the second binding pin is electrically connected and the first signal line to which the adjacent first binding pin is electrically connected are electrically connected to light-emitting pixels of a same color.

17. The display panel according to claim 13 or 14, wherein, among the first signal lines and the second binding pins electrically connected to the first signal lines in the second display region, an arrangement sequence of the first signal lines is same as an arrangement sequence of the second binding pins electrically connected to the plurality of first signal lines along the first direction.

18. The display panel according to claim 13 or 14, wherein among the first signal lines and the second binding pins electrically connected to the first signal lines in the second display region, an arrangement sequence of the plurality of first signal lines is reversed relative to an arrangement sequence of the plurality of second binding pins electrically connected to the plurality of first signal lines along the first direction.

19. The display panel according to claim 9, wherein the third connecting line has a first end connected to the first signal line, and a second end electrically connected to the second connecting line; and wherein, among the first ends and the second ends of some of the third connecting lines, an arrangement sequence of the first ends along the first direction is same as an arrangement sequence of the second ends corresponding to the first ends along the first direction.

20. The display panel according to claim 9, wherein the third connecting line has a first end connected to the first signal line, and a second end electrically connected to the second connecting line; and wherein, among first ends and second ends of some of the plurality of third connecting lines, an arrangement sequence of the first ends along the first direction is reversed relative to an arrangement sequence of the second ends corresponding to the first ends along the first direction.

21. The display panel according to claim 9, wherein an entirety of the third connecting line is located in a same layer, and the third connecting line is provided in a different layer from the first signal line.

22. The display panel according to claim 9, wherein the third connecting line is a folding line having a folding angle greater than or equal to 90°.

23. The display panel according to claim 9, wherein the third connecting line comprises a first connecting sub-line and a second connecting sub-line that are electrically connected to each other, the first connecting sub-line is electrically connected to the first signal line in the second display region, and the second connecting sub-line is electrically connected to the second connecting line; and wherein the first connecting sub-line is provided in a different layer from the second connecting sub-line.

24. The display panel according to claim 23, wherein the second connecting sub-line is provided in a same layer as the first signal line.

25. The display panel according to claim 24, wherein the third connecting line further comprises a first bridge portion through which the first connecting sub-line is electrically connected to the second sub-connection line, and the first bridge portion is provided in a same layer as a power voltage line.

26. The display panel according to claim 23, wherein the second display region further comprises a fourth connecting line; and wherein the fourth connecting line and the second connecting sub-line are provided in a same layer and electrically insulated from each other, and the fourth connecting line is electrically connected to a power voltage line or is floated.

27. The display panel according to claim 23, wherein the first connecting sub-line is provided in a same layer as a reset signal line.

28. The display panel according to claim 27, wherein the third connecting line further comprises a second bridge portion through which the first connecting sub-line is electrically connected to the first signal line in the second display region, and the second bridge portion is provided in a same layer as a power voltage line.

29. The display panel according to claim 23, wherein the second display region further comprises a fifth connecting line; and wherein the fifth connecting line and the first connecting sub-line are provided in a same layer and electrically insulated from each other, and the fifth connecting line is electrically connected to a power voltage line or is floated.

30. The display panel according to claim 23, wherein for the first connecting sub-line and the second connecting sub-line that are electrically connected to each other, a minimum angle between the first connecting sub-line and the second connecting sub-line is equal to 90°.

31. The display panel according to claim 9, wherein the third connecting line has a first end connected to the first signal line, and a second end electrically connected to the second connecting line; and the first signal line in the first display region has a third end connected to the first connecting line; and wherein the display region comprises at least two light-emitting pixels of different colors; among the second end and the third end adjacent to the second end, the first signal line electrically connected to the second end and the first signal line electrically connected to the third end are electrically connected to the light-emitting pixels of a same color.

32. A display apparatus, comprising a display panel, wherein the display panel comprises:

a main body comprising a display region and;

a rear folding portion comprising a plurality of binding pins, wherein the rear folding portion is bendable, and at least a part of the rear folding portion is configured to fold back to a side of a backlight surface of the main body;

wherein an edge of the rear folding portion that is connected to the main body is a first edge, and the first edge extends along a first direction;

wherein the main body comprises two second edges arranged opposite to each other along the first direction; and wherein a vertical distance between an endpoint of the first edge and a line where one of the second edges most adjacent to the endpoint is located is a first distance d1, and a minimum distance between the two second edges along the first direction is a second distance d2, and $0.025 \leq d1/d2 \leq 0.25$.

* * * * *